US012743561B2

(12) United States Patent
Myers et al.

(10) Patent No.: US 12,743,561 B2
(45) **Date of Patent: *Sep. 22, 2026**

(54) GENERATING TECHNICAL DRAWINGS FROM BUILDING INFORMATION MODELS

(71) Applicant: Procore Technologies, Inc., Carpinteria, CA (US)

(72) Inventors: Christopher Myers, Council, ID (US); Chris Bindloss, Santa Barbara, CA (US)

(73) Assignee: Procore Technologies, Inc., Carpinteria, CA (US)

( * ) Notice: Subject to any disclaimer, the term of this patent is extended or adjusted under 35 U.S.C. 154(b) by 77 days.

This patent is subject to a terminal disclaimer.

(21) Appl. No.: 18/820,567

(22) Filed: Aug. 30, 2024

(65) Prior Publication Data

US 2025/0103760 A1 Mar. 27, 2025

Related U.S. Application Data

(63) Continuation of application No. 18/105,669, filed on Feb. 3, 2023, now Pat. No. 12,079,548, which is a (Continued)

(51) Int. Cl.

*G06T 11/60* (2026.01)
*G06F 30/13* (2020.01)

(Continued)

(52) U.S. Cl.

CPC .............. *G06F 30/13* (2020.01); *G06F 30/20* (2020.01); *G06T 11/23* (2026.01); *G06T 11/60* (2013.01); *G06T 17/205* (2013.01)

(58) Field of Classification Search

None

See application file for complete search history.

(56) References Cited

U.S. PATENT DOCUMENTS

| | | | |
|---|---|---|---|
| 5,572,637 | A | 11/1996 | Brown et al. |
| 5,776,409 | A | 7/1998 | Almquist et al. |

(Continued)

FOREIGN PATENT DOCUMENTS

| | | |
|---|---|---|
| EP | 2369513 | 9/2011 |
| WO | 2020/102113 | 5/2020 |

OTHER PUBLICATIONS

PCT International Search Report and Written Opinion, PCT International Application No. PCT/US2020/016853, dated May 28, 2020, 12 pages.

(Continued)

*Primary Examiner* — Yanna Wu

(74) *Attorney, Agent, or Firm* — Lee Sullivan Shea & Smith LLP

(57) ABSTRACT

The present disclosure is directed to a software tool that facilitates the presentation of a three-dimensional view of a construction project as well as the generation of various types of two-dimensional technical drawings based on this three-dimensional view. In one implementation, the software tool causes a computing device to engage in the following operations. The computing device may receive a user input identifying at least one first mesh and at least one second mesh, determine portions of each identified mesh that intersect with a two-dimensional plane, and generate a two-dimensional drawing including a display of relevant dimensioning information based on the determined portions.

20 Claims, 16 Drawing Sheets
(10 of 16 Drawing Sheet(s) Filed in Color)

Related U.S. Application Data continuation of application No. 17/532,679, filed on Nov. 22, 2021, now Pat. No. 11,574,086, which is a continuation of application No. 16/594,877, filed on Oct. 7, 2019, now Pat. No. 11,182,513, which is a continuation-in-part of application No. 16/277,752, filed on Feb. 15, 2019, now Pat. No. 10,748,311.

(51) Int. Cl.

| | |
|---|---|
| ***G06F 30/20*** | (2020.01) |
| ***G06T 11/23*** | (2026.01) |
| ***G06T 17/20*** | (2006.01) |

(56) References Cited

U.S. PATENT DOCUMENTS

| | | | | |
|---|---|---|---|---|
| 6,036,911 | A | 3/2000 | Allison et al. | |
| 8,705,893 | B1 | 4/2014 | Zhang et al. | |
| 11,348,322 | B1 | 5/2022 | Treskunov et al. | |
| 2007/0174026 | A1 | 7/2007 | Mangon et al. | |
| 2007/0285424 | A1* | 12/2007 | Cheng ..................... | G06T 19/00 345/624 |
| 2013/0218890 | A1 | 8/2013 | Fernandes et al. | |
| 2014/0071126 | A1 | 3/2014 | Barneoud et al. | |
| 2014/0152651 | A1 | 6/2014 | Chen et al. | |
| 2014/0163931 | A1 | 6/2014 | Snyder et al. | |
| 2014/0218360 | A1 | 8/2014 | Dalgaard Larsen | |
| 2016/0196687 | A1 | 7/2016 | Alpert et al. | |
| 2016/0292918 | A1 | 10/2016 | Cummings et al. | |
| 2017/0185704 | A1 | 6/2017 | Kim | |
| 2018/0344290 | A1 | 12/2018 | Veronesi et al. | |
| 2018/0350142 | A1 | 12/2018 | Maruyama | |
| 2019/0050137 | A1 | 2/2019 | Mildrew et al. | |
| 2019/0051043 | A1 | 2/2019 | Hopper et al. | |
| 2019/0205484 | A1 | 7/2019 | Morkos et al. | |
| 2019/0228578 | A1 | 7/2019 | Moschini et al. | |
| 2019/0325089 | A1 | 10/2019 | Golparvar-Fard et al. | |

OTHER PUBLICATIONS

Choi, Jungsik et al., "Development of Application for Generation of Automatic 2D Drawings Based on OpenBIM", 35th International Symposium on Automation and Robotics in Constructions ISARC, Jul. 20-25, 2018, pp. 1-6.

Schweizer, Robert, "Spatial BIM Queries: A Comparison Between CPU and GPU Based Approaches", Bachelor's Thesis for the B.Sc. in Engineering Science, Technische Universitat Munchen, Jan. 27, 2015, 73 pages.

"3D Measurement", StreamBIM, https://guide.streambim.com/hc/en-us/articles/360014206773-3D-Measurement, downloaded from the Internet Jul. 9, 2020, 1 page.

"Quick Measure—One Click Measure", StreamBIM, https://guide.streambim.com/hc/en-us/articles/360014215080-Quick-Measure-One-Click-Measure, downloaded from the Internet Jul. 9, 2020, 3 pages.

"Quick Measure—Two Click Measure", StreamBIM, https://guide.streambim.com/hc/en-us/articles/360014293999-Quick-measure-Two-click-measure, downloaded from the Internet Jul. 9, 2020, 3 pages.

"StreamBIM Measurement", YouTube, https://www.youtube.com/watch?v=iAKBmkm83lk, downloaded from the Internet Jul. 9, 2020, 1 page.

Non-Final Office Action mailed Aug. 22, 2019, issued in connection with U.S. Appl. No. 16/277,679, filed Feb. 15, 2019, 11 pages.

Abioye, Sofiat O. et al., "Artificial Intelligence in the Construction Industry: A Review of Present Status, Opportunities and Future Challenges", Journal of Building Engineering, vol. 44, Oct. 5, 2021, 13 pages.

European Search Report, EP Application No. 20755628.3 dated Nov. 8, 2022, 11 pages.

Australia Examination Report, AU Application 2020221451 dated Oct. 2, 2024, 3 pages.

Screen capture from YouTube video clip entitled "SketchUp Skill Builder: Section Planes," 1 page, uploaded on Nov. 15, 2017 by user "SketchUp". Retrieved from Internet: <https://www.youtube.com/watch?v=xk9KGYBPZg4&t=148s>.

* cited by examiner

300

1000

GENERATING TECHNICAL DRAWINGS FROM BUILDING INFORMATION MODELS

CROSS-REFERENCE TO RELATED APPLICATION

This application is a continuation of, and claims the benefit of priority under 35 U.S.C. § 120 to, U.S. patent application Ser. No. 18/105,669, filed on Feb. 3, 2023 and titled "Generating Technical Drawings From Building Information Models," which is a continuation of, and claims the benefit of priority under 35 U.S.C. § 120 to, U.S. patent application Ser. No. 17/532,679, filed on Nov. 22, 2021 and titled "Generating Technical Drawings From Building Information Models," which is a continuation of, and claims the benefit of priority under 35 U.S.C. § 120 to, U.S. patent application Ser. No. 16/594,877, filed on Oct. 7, 2019 and titled "Generating Technical Drawings From Building Information Models," which is a continuation-in-part of, and claims the benefit of priority under 35 U.S.C. § 120 to, U.S. patent application Ser. No. 16/277,752, filed on Feb. 15, 2019 and titled "Generating Technical Drawings From Building Information Models," the contents of each of which are incorporated by reference herein in their entireties.

BACKGROUND

Construction projects are often complex endeavors involving the coordination of many professionals across several discrete phases. Typically, a construction project commences with a design phase, where architects design the overall shape and layout of a construction project, such as a building. Next, engineers engage in a planning phase where they take the architects' designs and produce engineering drawings and plans for the construction of the project. At this stage, engineers may also design various portions of the project's infrastructure, such as HVAC, plumbing, electrical, etc., and produce plans reflecting these designs as well. After, or perhaps in conjunction with, the planning phase, contractors may engage in a logistics phase to review these plans and begin to allocate various resources to the project, including determining what materials to purchase, scheduling delivery, and developing a plan for carrying out the actual construction of the project. Finally, during the construction phase, construction professionals begin to construct the project based on the finalized plans.

Overview

As a general matter, one phase of a construction project involves the creation, review, and sometimes revision, of plans of the construction project. In most cases, these plans comprise visual representations of the construction project that visually communicate information about the construction project, such as how to assemble or construct the project. Such visual representations tend to take one of at least two different forms. One form may be a two-dimensional technical drawing, such as an architectural drawing or a construction blueprint, in which two-dimensional line segments of the drawing represent certain physical elements of the construction project like walls and ducts. In this respect, a two-dimensional technical drawing could be embodied either in paper form or in a computerized form, such as an image file (e.g., a PDF, JPEG, etc.).

Two-dimensional technical drawings have advantages. For instance, they are often set out in a universally-recognized format that most, if not all, construction professionals can read and understand. Further, they are designed to be relatively compact, with one drawing being arranged to fit on a single piece of paper or in a computerized file format that requires minimal processing power and computer storage (e.g., a PDF viewer, JPEG viewer, etc.). Yet, two-dimensional drawings have disadvantages as well. For instance, it often takes multiple drawings in order to visually communicate an overview of an entire construction project. This is due to the fact that two-dimensional drawings tend not to efficiently present information about the construction project from a third (e.g., vertical) dimension. Typically, a construction project may have at least one two-dimensional technical drawing per floor of the construction project. Thus, for a construction project spanning, say, ten floors, the construction project will have at least ten two-dimensional technical drawings, and perhaps more to fully visually communicate the various aspects of the construction project.

To advance over two-dimensional technical drawings, computerized, three-dimensional technology was developed as another form in which information about a construction project can be visually communicated. In this respect, a three-dimensional model of the construction project would be embodied in a computerized form, such as in a building information model (BIM) file, with three-dimensional meshes visually representing the physical elements of the construction project (e.g., walls, ducts, etc.). Specialized software is configured to access a BIM file and, based on this BIM file, render a three-dimensional view of the construction project from one or more perspectives. This provided some advantages over two-dimensional technical drawings, namely that a construction professional could often get a full overview of the entire construction project based on a single three-dimensional view and thus may not have to shuffle through multiple two-dimensional drawings in order to conceptualize what the construction project looks like. In addition, the specialized software allowed a construction professional to navigate throughout the three-dimensional view and focus on elements of interest in the construction project, such as a particular wall or duct.

However, existing technology for presenting visual representations of construction projects has several limitations. For example, one such limitation is that existing software tools for rendering three-dimensional views of construction projects do not provide all the information about a construction project that may be available on certain two-dimensional technical drawings. For instance, dimensioning information for certain physical elements of a construction project may not be presented on a three-dimensional view of a construction project as doing so may clutter or obscure the three-dimensional presentation. Such information is more aptly displayed on an appropriate two-dimensional drawing.

Another limitation is that existing software tools for rendering three-dimensional views of construction projects do not have the capability to generate two-dimensional drawings that correspond to the three-dimensional view. This is problematic because, as mentioned, two-dimensional drawings may display certain information, such as dimensioning information, that is not (and perhaps cannot be) presented in the three-dimensional view of the construction project.

Another limitation with existing technology for presenting visual representations of construction projects is that, while some software tools exist that can render a three-dimensional view of the construction project from various perspectives, these software tools tend not to provide any overview of the entire construction project that is functional.

For instance, some software tools for rendering three-dimensional views of construction projects may also have the capability to present a static, two-dimensional drawing of the project as an inset to the rendering of a three-dimensional view (usually positioned, for instance, in the top left or top right corner of the screen). However, such an inset tends not be as functional as desired. For instance, in some cases, the inset does not display enough information about the construction project or does not provide any ability to use the inset to navigate about the three-dimensional model.

Yet another limitation with existing technology for presenting visual representations of construction projects is that, in some cases, neither a two-dimensional technical drawing nor a three-dimensional view readily provides desired information about the construction project. For instance, consider a scenario where construction plans call for a collection of multiple pipes to run parallel to a floor, but, perhaps as an oversight, no individual technical drawing nor any view of a three-dimensional model indicates the specific distance between each of these pipes. In scenarios like these, the construction professional would typically derive this information based on his or her own calculation, accounting for, among other things, the known dimension of an individual pipe, the total number of pipes in the collection, how far the first pipe is from the near wall, and how far the last pipe is from the far wall.

To address these problems (among others) with existing technology for presenting visual representations of construction projects, disclosed herein is software technology that enables a computing system to generate a two-dimensional technical drawing at a custom clip height based on a view of a three-dimensional model, which may then be presented to a user of the computer system (e.g., a construction professional). For instance, in one implementation, the disclosed software technology may cause a computing device to engage in the following operations: (1) receive an indication of a desired clip height of a three-dimensional view at which to generate a two-dimensional technical drawing; (2) identify a subset of meshes that intersect with a two-dimensional plane at the desired clip height; (3) determine respective portions of each mesh that intersect the two-dimensional plane at the desired clip height; (4) compile a dataset that defines the two-dimensional drawing; and (5) render the two-dimensional drawing using the compiled dataset. However, it should be understood that the disclosed software technology for generating a two-dimensional technical drawing based on a three-dimensional model may cause a computing system to perform various other operations as well.

To further address the aforementioned problems (among others) with existing technology for presenting visual representations of construction projects, also disclosed herein is software technology that enables a computing system to use a three-dimensional model as a basis for generating a two-dimensional drawing that may serve as a functional inset to the three-dimensional view, which may then be presented to a user of the computing system (e.g., a construction professional). For instance, in one implementation, the disclosed software technology may cause a computing device to engage in the following operations: (1) generate a top-down two-dimensional drawing of the three-dimensional model at a default clip height by, for instance, engaging in a similar process to that mentioned above; (2) retrieve from data storage a technical drawing file and use a pattern matching technique in order to match portions of the generated top-down two-dimensional technical drawing with portions of the retrieved technical drawing file; and (3) overlay the top-down two-dimensional drawing onto the retrieved technical drawing file in accordance with the pattern matching technique to thereby create a functional inset. However, it should be understood that the disclosed software technology for generating a functional two-dimensional technical drawing may cause a computing system to perform various other operations as well.

To still further address the aforementioned problems (among others) with existing technology for presenting visual representations of construction projects, also disclosed herein is software technology that enables a computing system to use a three-dimensional model as a basis for generating a two-dimensional drawing that includes additional dimensioning information that may not be otherwise available, which may then be presented to a user of the computing system (e.g., a construction professional). For instance, in one implementation, the disclosed software technology may cause a computing device to engage in the following operations: (1) receive an indication of an area of interest in a three-dimensional model that includes at least one mesh; (2) identify from among the meshes in the three-dimensional model the meshes that intersect with the area of interest; (3) determine portions of each mesh that intersects with the area of interest line; and (4) based on the determined portions, generate a two-dimensional drawing including a display of dimension information. In another implementation, the disclosed software technology may cause a computing device to engage in the following operations: (1) receive a user input identifying at least one first mesh and at least one second mesh; (2) determine portions of each identified mesh that intersect with a two-dimensional plane; and (3) generate a two-dimensional drawing including a display of relevant dimensioning information based on the determined portions. However, it should be understood that the disclosed software technology for generating a two-dimensional drawing having additional dimensioning information may cause a computing system to perform various other operations as well.

As set forth in more detail below, the disclosed software technology for presenting visual representations of construction projects may cause the computing system to engage in various other operations as well.

Accordingly, in one aspect, disclosed herein is a computer-implemented method that involves (a) rendering a three-dimensional view of a construction project using a three-dimensional model file that defines a set of meshes; (b) receiving an indication of a clip height at which to generate a two-dimensional drawing of the construction project, wherein the clip height is associated with the rendered three-dimensional view of the construction project; (c) identifying, from among the set of meshes defined by the three-dimensional model file, a subset of meshes that intersect with a two-dimensional plane positioned at the clip height; (d) for each respective mesh in the identified subset of meshes, generating a respective dataset that defines a particular portion of the respective mesh that intersects with the two-dimensional plane positioned at the clip height; (e) based at least on the respective dataset for each respective mesh in the identified subset of meshes, generating a compiled dataset that defines the two-dimensional drawing of the construction project at the clip height; and (f) rendering the two-dimensional drawing of the construction project using the compiled dataset.

In another aspect, disclosed herein is a computing system that comprises at least one processor, a non-transitory computer-readable medium, and program instructions stored on the non-transitory computer-readable medium that are executable by the at least one processor to cause the computing system to carry out the operations disclosed herein, including but not limited to the operations of the foregoing method.

In yet another aspect, disclosed herein is a non-transitory computer-readable medium comprising program instructions that are executable to cause a computing system to carry out the operations disclosed herein, including but not limited to the operations of the foregoing method.

One of ordinary skill in the art will appreciate these as well as numerous other aspects in reading the following disclosure.

BRIEF DESCRIPTION OF THE DRAWINGS

The patent or application file contains at least one drawing executed in color. Copies of this patent or patent application publication with color drawing(s) will be provided by the Office upon request and payment of the necessary fee.

DETAILED DESCRIPTION

The following disclosure makes reference to the accompanying figures and several example embodiments. One of ordinary skill in the art should understand that such references are for the purpose of explanation only and are therefore not meant to be limiting. Part or all of the disclosed systems, devices, and methods may be rearranged, combined, added to, and/or removed in a variety of manners, each of which is contemplated herein.

I. Example System Configuration

The present disclosure is generally directed to software technology for managing construction projects, and in particular to a software tool that renders a three-dimensional view of a construction project and generates additional two-dimensional views based on the three-dimensional view. As one possible implementation, this software technology may include both front-end software running on client stations that are accessible to individuals associated with construction projects (e.g., contractors, project managers, architects, engineers, designers, etc.) and back-end software running on a back-end platform (sometimes referred to as a "cloud" platform) that interacts with and/or drives the front-end software, and which may be operated (either directly or indirectly) by the provider of the front-end client software. As another possible implementation, this software technology may include front-end client software that runs on client stations without interaction with a back-end platform. The software technology disclosed herein may take other forms as well.

In general, such front-end client software may enable one or more individuals responsible for a construction project to perform various tasks related to the management of the construction project, which may take various forms. According to some implementations, these tasks may include: rendering three-dimensional views of the construction project, navigating through the various three-dimensional views of the construction project in order to observe the construction project from various perspectives, and using the software to generate two-dimensional drawings, as some non-limiting examples. Further, such front-end client software may take various forms, examples of which may include a native application (e.g., a mobile application) and/or a web application running on a client station, among other possibilities.

Figure 1:
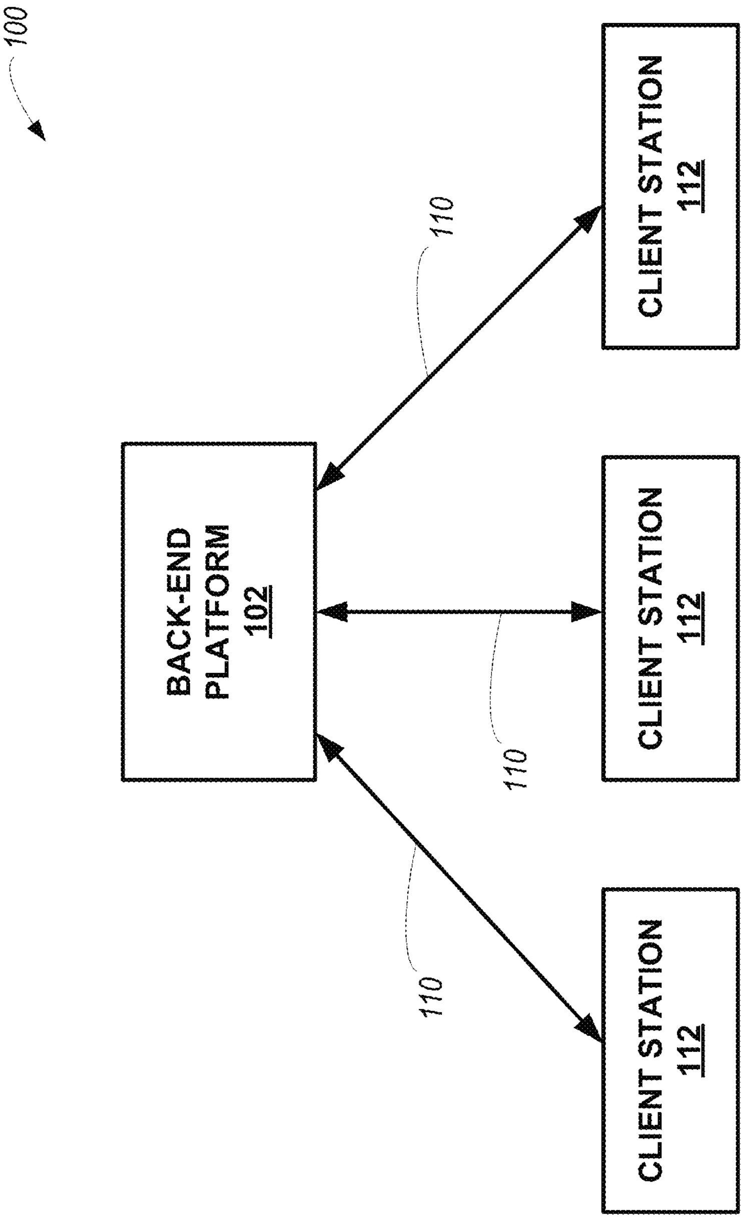
FIG. 1 depicts an example network configuration in which example embodiments may be implemented.

Turning now to the figures, FIG. 1 depicts an example network configuration 100 in which example embodiments of the present disclosure may be implemented. As shown in FIG. 1, network configuration 100 includes a back-end platform 102 that may be communicatively coupled to one or more client stations, depicted here, for the sake of discussion, as client stations 112.

Broadly speaking, back-end platform 102 may comprise one or more computing systems that have been provisioned with software for carrying out one or more of the functions disclosed herein, including but not limited to rendering three-dimensional views of models of a construction project, and/or transmitting data and/or instructions that cause one or more client stations 112 to output information related to a construction project, including the rendered views of the three-dimensional model of the construction project. The one or more computing systems of back-end platform 102 may take various forms and be arranged in various manners.

For instance, as one possibility, back-end platform 102 may comprise computing infrastructure of a public, private, and/or hybrid cloud (e.g., computing and/or storage clusters) that has been provisioned with software for carrying out one or more of the functions disclosed herein. In this respect, the entity that owns and operates back-end platform 102 may either supply its own cloud infrastructure or may obtain the cloud infrastructure from a third-party provider of "on demand" computing resources, such include Amazon Web Services (AWS) or the like. As another possibility, back-end platform 102 may comprise one or more dedicated servers that have been provisioned with software for carrying out one or more of the functions disclosed herein. Other implementations of back-end platform 102 are possible as well.

In turn, client stations 112 may each be any computing device that is capable of running the front-end software disclosed herein. In this respect, client stations 112 may each include hardware components such as a processor, data storage, a user interface, and a network interface, among others, as well as software components that facilitate the client station's ability to run the front-end software disclosed herein (e.g., operating system software, web browser software, etc.). As representative examples, client stations 112 may each take the form of a desktop computer, a laptop, a netbook, a tablet, a smartphone, and/or a personal digital assistant (PDA), among other possibilities.

As further depicted in FIG. 1, back-end platform 102 is configured to interact with client stations 112 over respective communication paths 110. In this respect, each communication path 110 between back-end platform 102 and one of client stations 112 may generally comprise one or more communication networks and/or communications links, which may take any of various forms. For instance, each respective communication path 110 with back-end platform 102 may include any one or more of point-to-point links, Personal Area Networks (PANs), Local-Area Networks (LANs), Wide-Area Networks (WANs) such as the Internet or cellular networks, cloud networks, and/or operational technology (OT) networks, among other possibilities. Further, the communication networks and/or links that make up each respective communication path 110 with back-end platform 102 may be wireless, wired, or some combination thereof, and may carry data according to any of various different communication protocols. Although not shown, the respective communication paths 110 between client stations 112 and back-end platform 102 may also include one or more intermediate systems. For example, it is possible that back-end platform 102 may communicate with a given client station 112 via one or more intermediary systems, such as a host server (not shown). Many other configurations are also possible.

The interaction between client stations 112 and back-end platform 102 may take various forms. As one possibility, client stations 112 may send certain user input related to a construction project to back-end platform 102, which may in turn trigger back-end platform 102 to take one or more actions based on the user input. As another possibility, client stations 112 may send a request to back-end platform 102 for certain project-related data and/or a certain front-end software module, and client stations 112 may then receive project-related data (and perhaps related instructions) from back-end platform 102 in response to such a request. As yet another possibility, back-end platform 102 may be configured to "push" certain types of project-related data to client stations 112, such as rendered three-dimensional views, in which case client stations 112 may receive project-related data (and perhaps related instructions) from back-end platform 102 in this manner. As still another possibility, back-end platform 102 may be configured to make certain types of project-related data available via an API, a service, or the like, in which case client stations 112 may receive project-related data from back-end platform 102 by accessing such an API or subscribing to such a service. The interaction between client stations 112 and back-end platform 102 may take various other forms as well.

In practice, client stations 112 may each be operated by and/or otherwise associated with a different individual that is associated with a construction project. For example, an individual tasked with the responsibility for creating project-related data, such as data files defining three-dimensional models of a construction project may access one of the client stations 112, whereas an individual tasked with the responsibility for reviewing and revising data files defining three-dimensional models of a construction project may access another client station 112, whereas an individual tasked with the responsibility for performing work related to project-related data, such as an on-site construction professional may access yet another client station 112. However, client stations 112 may be operated by and/or otherwise associated with individuals having various other roles with respect to a construction project as well. Further, while FIG. 1 shows an arrangement in which three particular client stations are communicatively coupled to back-end platform 102, it should be understood that an arrangement may include more or fewer client stations.

Although not shown in FIG. 1, back-end platform 102 may also be configured to receive project-related data from one or more external data sources, such as an external database and/or another back-end platform or platforms. Such data sources—and the project-related data output by such data sources—may take various forms.

It should be understood that network configuration 100 is one example of a network configuration in which embodiments described herein may be implemented. Numerous other arrangements are possible and contemplated herein. For instance, other network configurations may include additional components not pictured and/or more or less of the pictured components.

II. Example Computing Device

Figure 2:
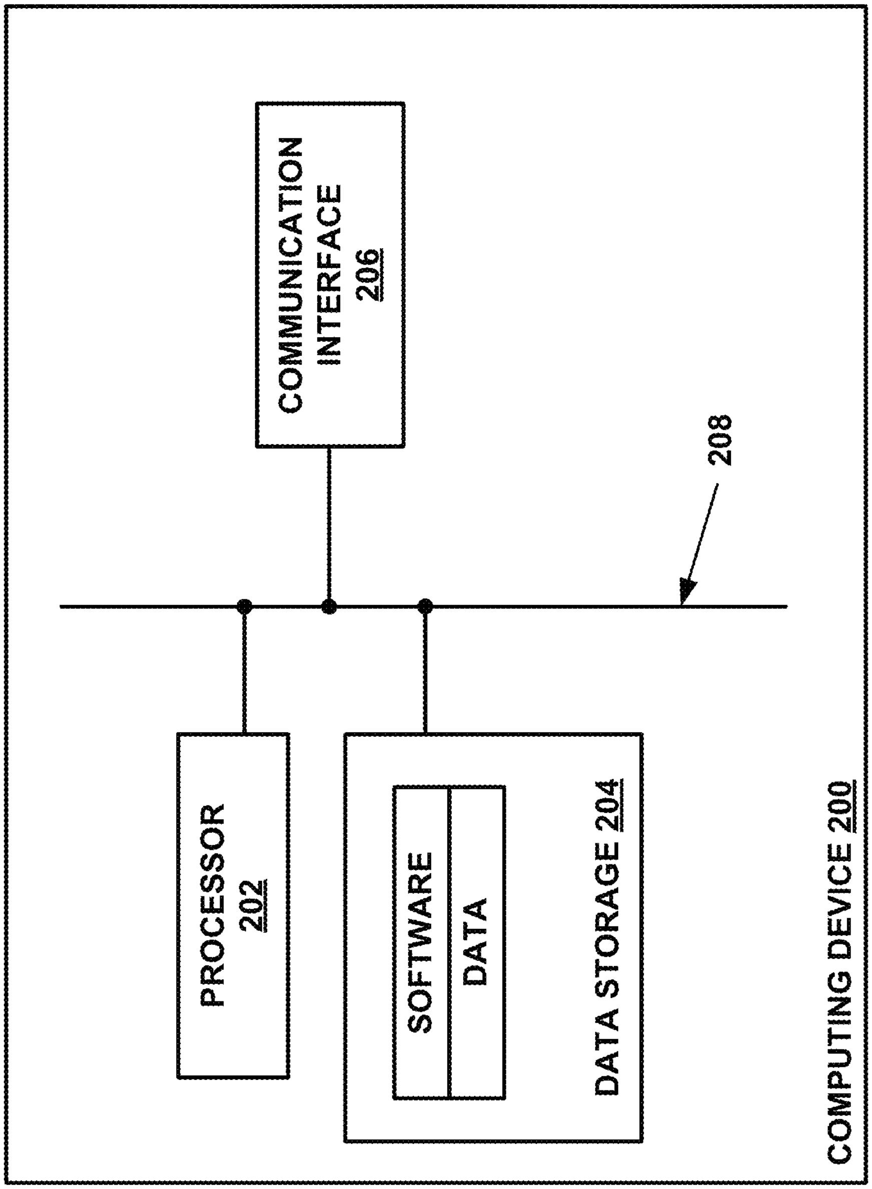
FIG. 2 depicts an example computing platform that may be configured carry out one or more of the functions of the present disclosure.

FIG. 2 is a simplified block diagram illustrating some structural components that may be included in an example computing device 200, which could serve as, for instance, the back-end platform 102 and/or one or more of client stations 112 in FIG. 1. In line with the discussion above, computing device 200 may generally include at least a processor 202, data storage 204, and a communication interface 206, all of which may be communicatively linked by a communication link 208 that may take the form of a system bus or some other connection mechanism.

Processor 202 may comprise one or more processor components, such as general-purpose processors (e.g., a single- or multi-core microprocessor), special-purpose processors (e.g., an application-specific integrated circuit or digital-signal processor), programmable logic devices (e.g., a field programmable gate array), controllers (e.g., microcontrollers), and/or any other processor components now known or later developed. In line with the discussion above, it should also be understood that processor 202 could comprise processing components that are distributed across a plurality of physical computing devices connected via a network, such as a computing cluster of a public, private, or hybrid cloud.

In turn, data storage 204 may comprise one or more non-transitory computer-readable storage mediums, examples of which may include volatile storage mediums such as random-access memory, registers, cache, etc. and non-volatile storage mediums such as read-only memory, a hard-disk drive, a solid-state drive, flash memory, an optical-storage device, etc. In line with the discussion above, it should also be understood that data storage 204 may comprise computer-readable storage mediums that are distributed across a plurality of physical computing devices connected via a network, such as a storage cluster of a public, private, or hybrid cloud.

As shown in FIG. 2, data storage 204 may be provisioned with software components that enable the computing device 200 to carry out the operations disclosed herein. These software components may generally take the form of program instructions that are executable by the processor 202 to carry out the disclosed functions, which may be arranged together into software applications, virtual machines, software development kits, toolsets, or the like, all of which are referred to herein as a software tool or software tools. Further, data storage 204 may be arranged to store project-related data in one or more databases, file systems, or the like. Data storage 204 may take other forms and/or store data in other manners as well.

Communication interface 206 may be configured to facilitate wireless and/or wired communication with other computing devices or systems, such as one or more client stations 112 when computing device 200 serves as back-end platform 102, or as back-end platform 102 when computing device 200 serves as one of client stations 112. As such, communication interface 206 may take any suitable form for carrying out these functions, examples of which may include an Ethernet interface, a serial bus interface (e.g., Firewire, USB 3.0, etc.), a chipset and antenna adapted to facilitate wireless communication, and/or any other interface that provides for wireless and/or wired communication. Communication interface 206 may also include multiple communication interfaces of different types. Other configurations are possible as well.

Although not shown, computing device 200 may additionally include one or more other interfaces that provide connectivity with external user-interface equipment (sometimes referred to as "peripherals"), such as a keyboard, a mouse or trackpad, a display screen, a touch-sensitive interface, a stylus, a virtual-reality headset, speakers, etc., which may allow for direct user interaction with computing device 200.

It should be understood that computing device 200 is one example of a computing device that may be used with the embodiments described herein. Numerous other arrangements are possible and contemplated herein. For instance, other computing devices may include additional components not pictured and/or more or fewer of the pictured components.

III. Example Visual Representations of Construction Projects

As mentioned above, one aspect of managing a construction project involves the creation, review, and sometimes revision, of plans for the construction project. These plans assist construction professionals in carrying out the construction project. For example, some plans include written statements, such a punch list or submittal log, which may communicate, for instance, what materials are needed during construction. Other plans may include visual representations of the construction project that visually communicate to the construction professionals how to assemble or construct the project.

Depending on the type of construction project, these visual representations tend to take one of two different forms. As one possibility, these visual representations may take the form of a set of two-dimensional technical drawings, such as architectural drawings, engineering schematics, or construction blueprints, among others. From these two-dimensional technical drawings, the construction professionals can determine how to construct the project. As another possibility, these visual representations may take the form of a computerized, three-dimensional visual representation of the construction project. Construction professionals can use a corresponding software tool to review the three-dimensional visual representation, often in conjunction with a review of two-dimensional technical drawings, as an aid during the construction process. Set forth below is a short overview of each of these types of visual representations of construction projects.

A. Two-Dimensional Technical Drawings

Figure 3:
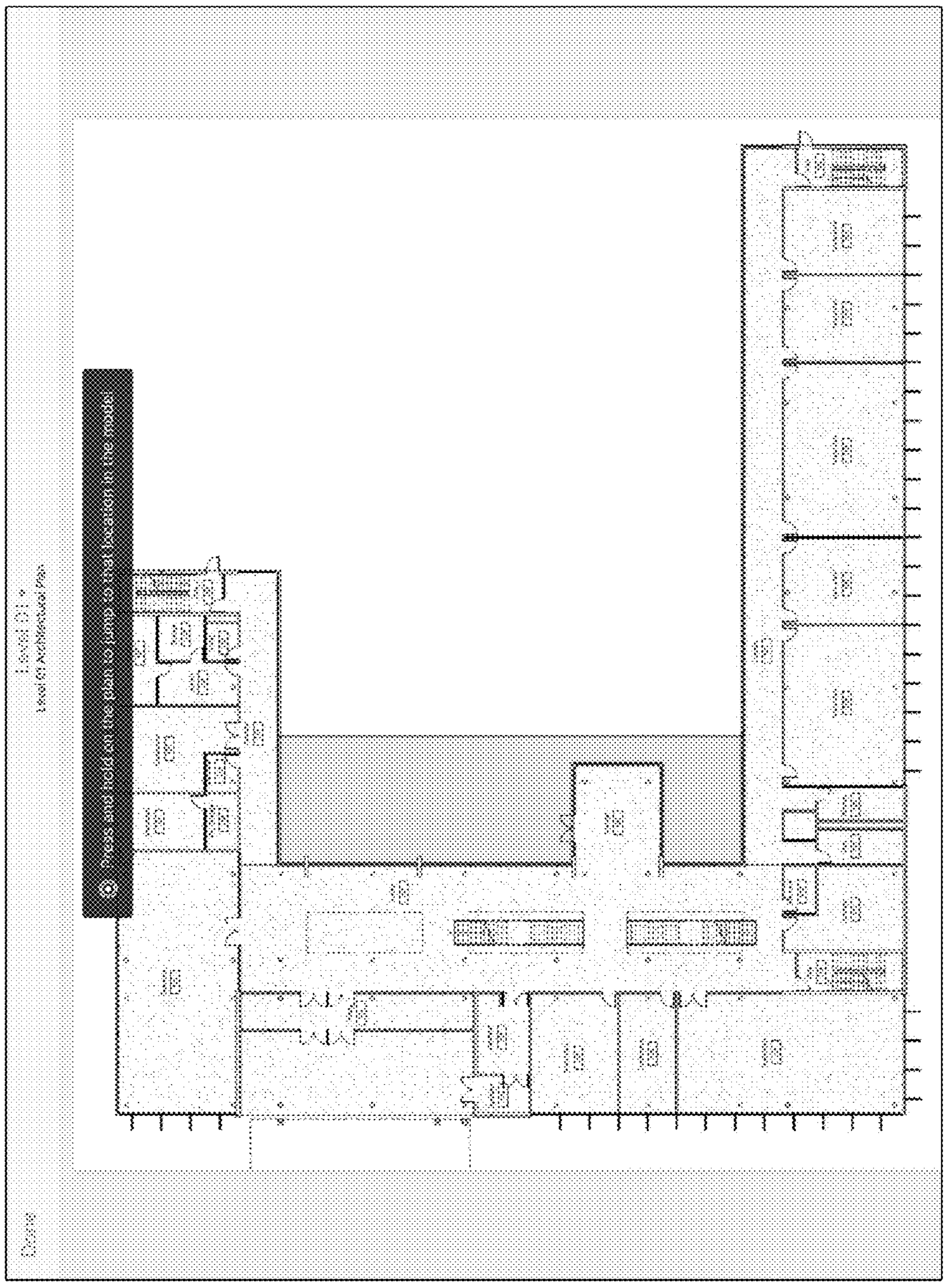
FIG. 3 depicts an example two-dimensional technical drawing.

As mentioned, one way to visually represent information about a construction project is through two-dimensional technical drawings. Generally, a two-dimensional technical drawing serves to visually communicate a limited amount of information about the construction project in order to aid in the construction, or the further design, of the project. To illustrate, FIG. 3 depicts one example of a two-dimensional technical drawing in the form of an architectural drawing 300, which may visually communicate how the construction project is laid out. To do this, an architectural drawing, such as architectural drawing 300 may comprise a scaled drawing depicting certain foundational elements of the construction project (e.g., floors, walls, ceilings, doorways, and support elements), with perhaps visual indications of additional relevant aspects of these foundational elements, such as measurements, dimensions, materials, etc.

Another example of a two-dimensional technical drawing is a schematic that visually communicates how the heating, ventilation, and air conditioning (HVAC) ductwork is routed throughout the building. Like the architectural drawing, this schematic may visually communicate the HVAC ductwork routing through the use of a scaled depiction of the ductwork along with indications of other relevant aspects of the ductwork, such as measurements, dimensions, materials, etc.

Because technical drawings such as these are limited to two dimensions, multiple technical drawings may be used when there is a need to visually communicate aspects from a third (e.g., vertical) dimension. For instance, a construction project may comprise multiple floors and the design of the project may call for the shape or structure to change from floor to floor. In such a case, there may be one (or more) technical drawings for each floor of the construction project. And although just two example types of technical drawings were mentioned above, a typical construction project may involve the use of many other types of other technical drawings, including for instance technical drawings associated with landscaping, electrical, plumbing, installation, etc. For these reasons, a single construction project may involve the use of tens, hundreds, or perhaps, thousands of technical drawings.

Generally, two-dimensional technical drawings, like the two examples described above, are created at the outset of a construction project by architects, designers, engineers, or some combination thereof. Traditionally, these professionals would construct such two-dimensional technical drawings by hand. But today, professionals typically construct two-dimensional technical drawings with the aid of computer drafting software, such as existing CAD software known and used by professionals in the industry.

Two-dimensional technical drawings have advantages. For instance, a single two-dimensional technical drawing can visually communicate vast amounts of useful information. In some cases, construction professionals can get an overview of an entire area of a construction project by referring to a single technical drawing. Moreover, once created, technical drawings require a relatively small amount of computer storage and processing power to store and view. Construction professionals can often review finished technical drawings with off-the-shelf software document viewers, such as portable document format (PDF) software viewers.

Yet two dimensional technical drawings have, because these technical drawings are typically created at the outset of the construction project—that is, well before construction has actually begun—these drawings generally will not reflect changes to the project that happen during, say, the construction phase. When a change to the construction project happens after the technical drawings are completed, architects, designers, or engineers may be called upon to revise the existing technical drawings or create new drawings altogether to reflect the change.

Additionally, technical drawings that are generated at the outset of the construction project may not always visually communicate the specific information desired by the construction professional who later accesses the technical drawings. For instance, during construction a construction professional may determine that it would be useful to have a technical drawing, such as an architectural plan, that shows only support structures made of concrete and does not show support structures made from other materials, such as steel. But such a technical drawing may not be readily accessible because the complete set of technical drawings may have been already completed by that point. Thus, the construction professional may have to wait, or go without, his or her desired technical drawing. As mentioned, one solution to this issues would be to call upon an engineer, designer, or architect to regenerate the technical drawings with this requested information. But this is often a costly and time-consuming process, which may not be feasible depending on the project's budget as well as the stage of construction.

B. Three-Dimensional Visual Representations

As also mentioned, another way to visually represent information about a construction project is through a computerized, three-dimensional model of the construction project. In order to facilitate the creation and use of a computerized, three-dimensional model of the construction project, a team of architects, designers, and/or engineers engage in a process referred to as Building Information Modeling.

As a general matter, Building Information Modeling refers to the process of designing and maintaining a computerized representation of physical and functional characteristics of a construction project, such as a building. Specialized software tools can then access this computerized representation and process it to visually communicate how to construct the building via a navigable, three-dimensional model of the building and its infrastructure.

More specifically, but still by way of example, when architects, designers, and/or engineers engage in Building Information Modeling for a specific construction project, they generally produce what is referred to as a Building Information Model (BIM) file. In essence, a BIM file is a computerized description of the individual physical elements that comprise the construction project, such as the physical structure of the building, including walls, floors, and ceilings, as well as the building's infrastructure, including pipes, ducts, conduits, etc. This computerized description can include a vast amount of data describing the individual physical elements of the construction project and the relationships between these individual physical elements, including for instance, the relative size and shape of each element, and an indication of where each element will reside in relation to the other elements in the construction project.

BIM files can exist in one or more proprietary or open-source computer-file formats and are accessible by a range of specialized software tools. One type of specialized software tool that can access BIM files is referred to as a "BIM viewer." A BIM viewer is software that accesses the information contained within a BIM file or a combination of BIM files for a particular construction project and then, based on that file or those files, is configured to cause a computing device to render a three-dimensional view of the computerized representation of the construction project. This view is referred to herein as a "three-dimensional BIM view" or simply a "three-dimensional view."

In order for BIM viewer software to be able to cause a computing device to render a three-dimensional view of the construction project, BIM files typically contain data that describes the attributes of each individual physical element (e.g., the walls, floors, ceilings, pipes, ducts, etc.) of the construction project. For instance, for an air duct designed to run across the first-floor ceiling of a building, a BIM file for this building may contain data describing how wide, how long, how high, and where, in relation to the other individual physical elements of the construction project, the duct is positioned.

There are many ways for BIM files to arrange and store data that describes the attributes of the individual physical elements of a construction project. In one specific example, BIM files may contain data that represents each individual physical component in the construction project (e.g., an air duct) as a mesh of geometric triangles such that when the geometric triangles are visually stitched together by BIM viewer software, the triangles form a mesh, which represents a scaled model of the physical component (e.g., the air duct). In this respect, the BIM file may contain data that represents each triangle of a given mesh as set of coordinates in three-space. For instance, for each triangle stored in the BIM file, the BIM file may contain data describing the coordinates of each vertex of the triangle (e.g., an x-coordinate, a y-coordinate, and a z-coordinate for the first vertex of the triangle; an x-coordinate, a y-coordinate, and a z-coordinate for the second vertex of the triangle; and an x-coordinate, a y-coordinate, and a z-coordinate for the third vertex of the triangle). A given mesh may be comprised of thousands, tens of thousands, or even hundreds of thousands of individual triangles, where each triangle may have a respective set of three vertices and corresponding sets of three-space coordinates for those vertices. However, other ways for a BIM file to contain data that represents each individual physical component in a construction project are possible as well.

Figure 4:
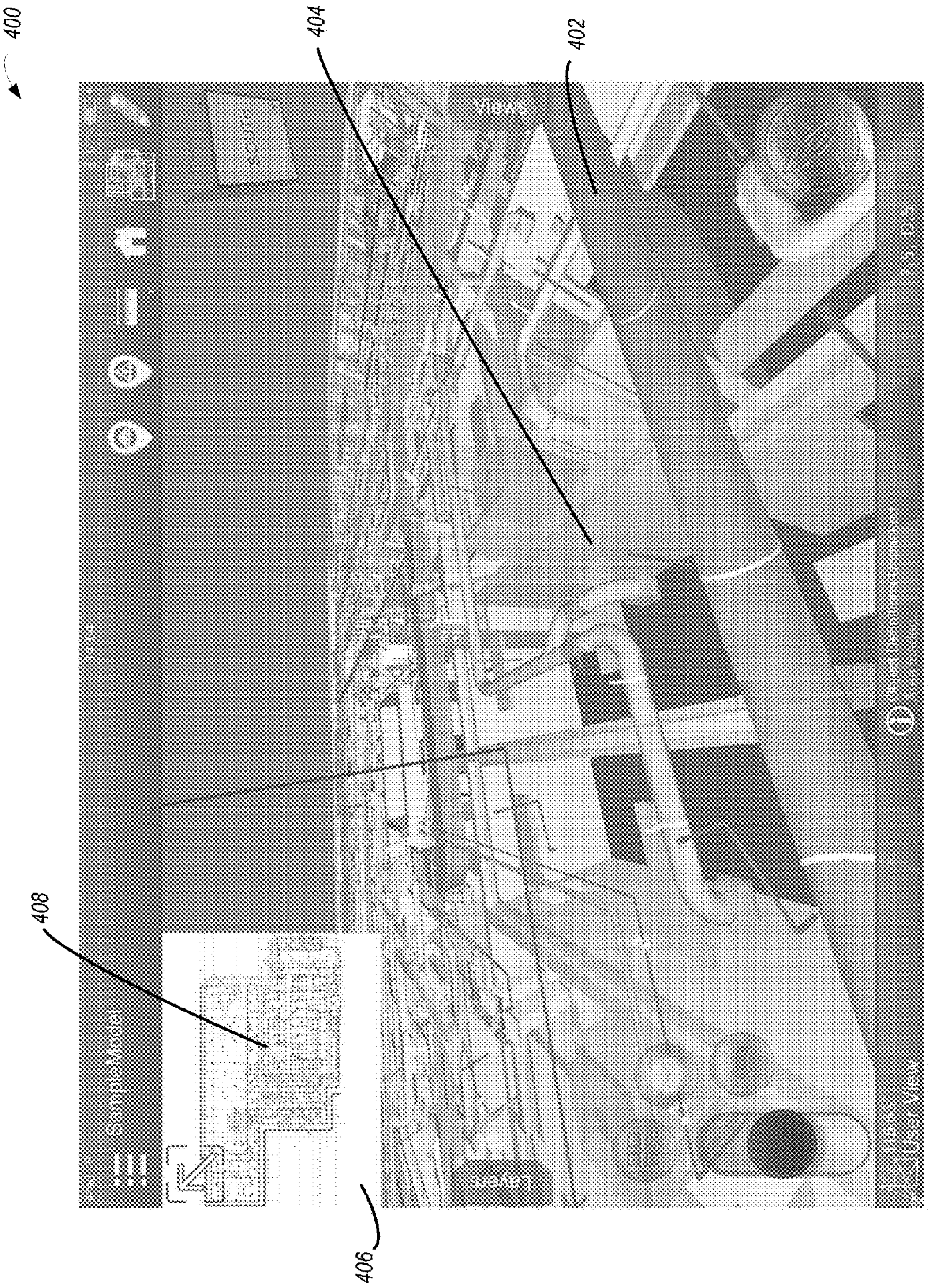
FIG. 4 depicts an example three-dimensional BIM view, in accordance with one embodiment of the present disclosure.

To illustrate one example of a three-dimensional view, FIG. 4 depicts an example snapshot 400 of a GUI, which includes a three-dimensional view of a construction project rendered at a particular perspective. Snapshot 400 may be generated by, for instance, a software tool running on a client station, such as one of client stations 112 (FIG. 1), accessing a BIM file, and then rendering a three-dimensional view of the construction project based on that BIM file and presenting it via a display interface of that client station. Alternatively, a back-end platform, such as back-end platform 102 (FIG. 1) may access a BIM file and may generate a set of instructions for rendering a three-dimensional view of the construction project based on that BIM file. Back-end platform 102 may then send these instructions to one of client stations 112, which in turn may present a three-dimensional view of the construction project it via a display interface of that client station based on these instructions. Still other arrangements are possible.

As depicted, snapshot 400 includes a three-dimensional view of a construction project from a particular perspective. The three-dimensional view depicted in FIG. 4 includes a number of meshes that represent individual physical components of the construction project, such as floors, walls, pipes, and ducts, etc. In particular, depicted in FIG. 4 is, among others, a mesh 402, which represents an air duct, and a mesh 404, which represents a wall. Of course, in other examples, other meshes are possible as are other layouts and designs of construction projects.

The client station presenting snapshot 400 may be configured to adjust the perspective at which the three-dimensional view is presented in response to, for instance, receiving user inputs at the client station. The client station may do this in various ways. As one possibility, the client station may reposition the perspective either forward or backward along an x-axis of the model in response to receiving a first type of user input via a peripheral, such as pressing the up arrow or down arrow on a keyboard or a click and drag with a mouse. The client station may reposition the perspective laterally along a y-axis of the model in response to receiving a second type of user input via a peripheral, such as pressing the left arrow or right arrow on a keyboard or a different type of click and drag with a mouse. The client station may reposition the perspective either up or down along a z-axis of the model in response to receiving a third type of user input via a peripheral, such as pressing a combination of keys on a keyboard (e.g., the Control key and the up arrow, or the Control key and the down arrow) or yet a different type of click and drag with a mouse. The client station may reposition the orientation of the perspective (i.e., the "camera" angle) in response to receiving a fourth type of user input via a peripheral, such as pressing a combination of keys on a keyboard (e.g., the Alt key and the up arrow, or the Control key and the down arrow) or yet a different type of click and drag with a mouse.

As another possibility, the computing device may reposition the perspective simultaneously along a combination of one or more of the x-axis, the y-axis, and the z-axis of the model in response to receiving a first type of user input at a touch-screen of the computing device, such as a touch and drag gesture made with one finger. The computing device may reposition the orientation of the perspective in response to receiving a second type of user input at a touch-screen of the computing device, such as a touch and drag gesture made with two fingers. However, other examples of adjusting the perspective at which the three-dimensional view is presented are possible as well.

In addition to data describing the individual triangles of a mesh, some BIM files may contain additional data that helps to summarize information relating to the various meshes. For instance, a BIM file may contain, for each mesh, data describing a "bounding box." Conceptually, a bounding box is an imaginary box surrounding the mesh on all sides, with the edges of this box being located at the outermost edges of the mesh. As such, the entire mesh fits inside of this bounding box with no part of the mesh protruding from the bounding box. In this way, the bounding box represents the maximum dimensions of the mesh in rectangular form. BIM viewer software may utilize bounding boxes stored in BIM files in various ways. For instance, it usually takes less storage space to store data describing a bounding box compared to data describing an entire mesh. This is due to the fact that a mesh may comprise of many thousands of triangles in order to accurately represent the mesh's surface, which in some cases is irregular (e.g., the curved surface of a pipe), whereas a bounding box can typically be represented by data describing just eight vertices of a rectangular box. Some BIM viewer software may be configured to operate in a mode designed to conserve processing power and/or storage space in which the BIM viewer software causes a computing device to render just bounding boxes as opposed to rendering the full meshes. By doing so, the BIM viewer software can visually communicate a "low resolution" version of the construction project. Other ways of utilizing bounding boxes, and other ways of containing additional data to help summarize information relating to the various meshes, are possible as well.

BIM files may contain additional data as well, including data describing other attributes of the individual physical elements of the construction project that may or may not be related to the element's specific position in three space. By way of example, this data may include data describing what system or sub-system the component is associated with (e.g., structural, plumbing, HVAC, electrical, etc.), data describing what material or materials the individual physical element is made of; what manufacturer the element comes from; what stage of manufacture the element is in; where the element currently resides (e.g., data indicating that the element is on a truck for delivery to the construction site, and/or once delivered, data indicating where at the construction site the delivered element resides); and/or various identification numbers assigned to the element (e.g., a serial number, part number, model number, tracking number, etc.), as well as others.

Together, these other attributes are generally referred to as metadata. BIM viewer software may utilize this metadata in various ways. For instance, some BIM viewer software may be configured to present different views based on metadata (e.g., displaying all meshes that represent HVAC components but hiding all meshes that represent plumbing components; and/or displaying meshes representing metal components in a certain color and displaying meshes representing wood components in another color, etc.). Alternatively or additionally, BIM viewers can display certain subsets of the metadata based on user input. For example, a user may provide a user input to the BIM viewer software though a click or tap on a GUI portion displaying a given mesh, and in response, the BIM viewer software may cause a GUI to display some or all of the attributes of the physical element represented by the given mesh. Other examples are possible as well.

As mentioned, BIM viewer software is generally deployed on client stations, such as client stations 112 of FIG. 1 (which, as described above, can generally take the form of a desktop computer, a laptop, a tablet, or the like). As such, construction professionals can utilize BIM viewer software during all phases of the construction project and can access a BIM file for a particular construction project in an office setting as well as on the construction site. Accordingly, BIM viewer software assists construction professionals with, among other things, the design and construction of the project and/or to identify issues that may arise during such construction.

BIM technology has advantages. For instance, as described, BIM viewers can use BIM files in order to render three-dimensional views (such as the view depicted in snapshot 400 in FIG. 4) of various elements of the construction project. This can help construction professionals identify potential construction issues prior to encountering those issues in during construction as well as conceptualize what the finished building will look like.

However, existing BIM technology has certain limitations as well. One limitation is that three-dimensional BIM views may be cumbersome to navigate about and may thus not present information as quickly or efficiently as a two-dimensional technical drawing. Additionally, while three-dimensional BIM views may display various meshes positioned about the construction project, the three-dimensional BIM view may not display precise measurements associated with these meshes as doing so may tend to clutter, and perhaps obscure, the display of the overall project. Additionally, three-dimensional BIM views generally require more computing resources to render and display than traditional two-dimensional technical drawings, which, as mentioned, can typically be presented in PDF form.

IV. Example Operations

Disclosed herein is new software technology that is designed to help remedy some of the aforementioned limitations with technology for rendering three-dimensional views of construction projects. For instance, disclosed herein is a software tool that generates a two-dimensional drawing of a construction project based on a three-dimensional view of the construction project and a custom clip height associated with the three-dimensional view. In one aspect, the disclosed software tool may cause a computing device to generate a two-dimensional technical drawing based on a BIM file and a given clip height clip height associated with a given view rendered using the BIM file. In another aspect, the disclosed software tool may cause a computing device to generate a functional two-dimensional inset to a three-dimensional view of a BIM file based on the BIM file and a current three-dimensional BIM view. In yet another aspect, the disclosed software tool may cause a computing device to generate a custom dimension view that is arranged to present certain dimension information related to one or more meshes.

Example operations that may be carried out by one or more computing devices running the disclosed software tool are discussed in further detail below. For purposes of illustration only, these example operations are described as being carried out by a computing device, such as computing device 200 (FIG. 2), which as described above, may serve as one or more of client stations 112 (FIG. 1) and/or back-end platform 102 (FIG. 1). In this respect, it should be understood that, depending on the implementation, the operations discussed herein below may be carried out entirely by a single computing device, such as one or more of client stations 112 or by back-end platform 102, or may be carried out by a combination of computing devices, with some operations being carried out by back-end platform 102 (such as computational processes and data-access operations) and other operations being carried out by one or more of client stations 112 (such as display operations and operations that receive user inputs). However, other arrangements are possible as well.

To help describe some of these operations, flow diagrams may also be referenced to describe combinations of operations that may be performed by a computing device. In some cases, a block in a flow diagram may represent a module or portion of program code that includes instructions that are executable by a processor to implement specific logical functions or steps in a process. The program code may be stored on any type of computer-readable medium, such as non-transitory computer readable media (e.g., data storage 204 (FIG. 2)). In other cases, a block in a flow diagram may represent circuitry that is wired to perform specific logical functions or steps in a process. Moreover, the blocks shown in the flow diagrams may be rearranged into different orders, combined into fewer blocks, separated into additional blocks, and/or removed, based upon the particular embodiment. Flow diagrams may also be modified to include additional blocks that represent other functionality that is described expressly or implicitly elsewhere herein.

A. Generating two-dimensional Technical Drawings

As noted above, in one aspect, the disclosed software tool may cause a computing device to carry out a process for generating a two-dimensional technical drawing based on a BIM file and a given clip height associated with a given three-dimensional view rendered using the BIM file. This process may take various forms.

Figure 5:
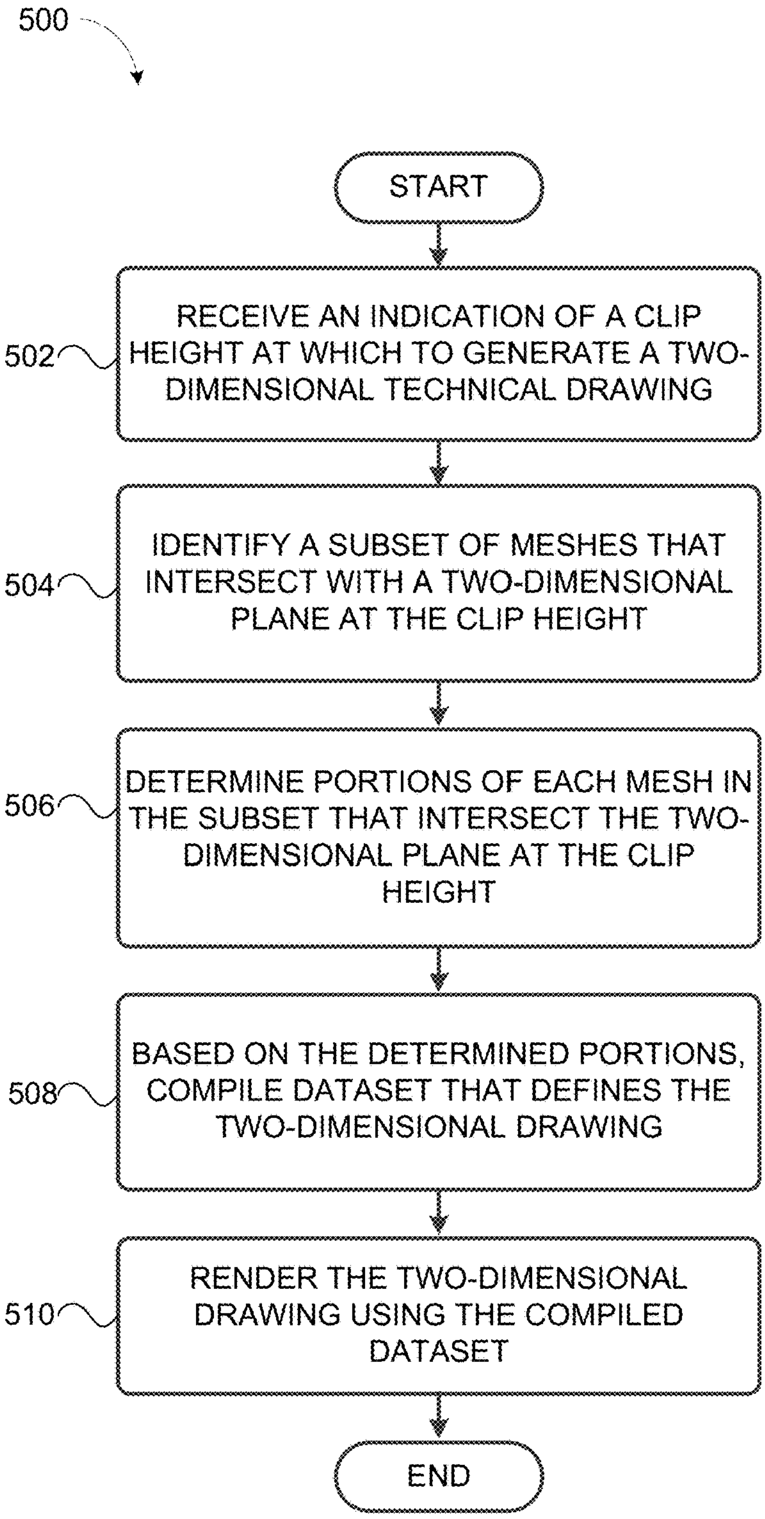
FIG. 5 is a flow diagram depicting example operations for generating a two-dimensional technical drawing at a custom clip height, according to one embodiment of the present disclosure.

With reference now to flow diagram 500 of FIG. 5, one example of a process carried out in accordance with the disclosed software tool for generating a two-dimensional technical drawing based on a BIM file and a given clip height is illustrated and described. In practice, this process may be commenced while the computing device is presenting a three-dimensional view via a GUI. In some implementations, for instance, the computing device may receive an indication that a user has requested creation of a two-dimensional technical drawing, such as through the push of a button or the selection of a menu command. However, other ways to commence the process are possible as well.

Once the process is commenced, the process may generally involve the following operations: (i) at block 502, while presenting a given three-dimensional view of a construction project based on a BIM file, the computing device may receive an indication of a desired clip height of the given three-dimensional view at which to generate a two-dimensional technical drawing, (ii) at block 504, the computing device identifies a given subset of the meshes within the BIM file that intersect with a two-dimensional plane at the desired clip height, (iii) at block 506, the computing device determines respective portions of each mesh in the given subset of meshes that intersect the two-dimensional plane at the desired clip height, (iv) at block 508, the computing device compiles a dataset that defines the two-dimensional drawing, and (v) at block 510, the computing device may render the two-dimensional drawing using the compiled dataset. Each of these operations will now be discussed in further detail.

At block 502, the computing device receives an indication of a desired clip height at which to generate a two-dimensional technical drawing. In one implementation, the indication of the desired clip height may take the form of a numerical indication of the desired clip height, which may be input by a user via a keyboard, a mouse, a touchscreen, or the like. For instance, the computing device may present an input box via a user interface of the computing device whereupon the user may enter into the input box a desired clip height (e.g., "4 feet" or just "4").

In some implementations, the indication of the desired clip height may take the form of a graphical selection of a desired clip height, which may be input by a user via a keyboard, a mouse, a touchscreen, or the like. To facilitate this, the computing device may display the three-dimensional BIM view as though there is an invisible two-dimensional plane at a given clip height within the three-dimensional BIM view, which spans the three-dimensional BIM view and is parallel to the floor of the construction project. To indicate where the invisible two-dimensional plane is located, the computing device may be configured to adjust the three-dimensional view based on the height of the invisible two-dimensional plane. For instance, the computing device may hide any meshes or portions of a mesh that lie above the invisible two-dimensional plane but show any meshes or portions of a mesh that lie below the invisible two-dimensional plane. By doing so, the computing device presents a preview of the meshes that will be used to generate the two-dimensional technical drawing. More specifically, any meshes or portions of a mesh that lie above the invisible two-dimensional plane (and are thus not displayed) will not be visible on the two-dimensional technical drawing.

Figure 6B:
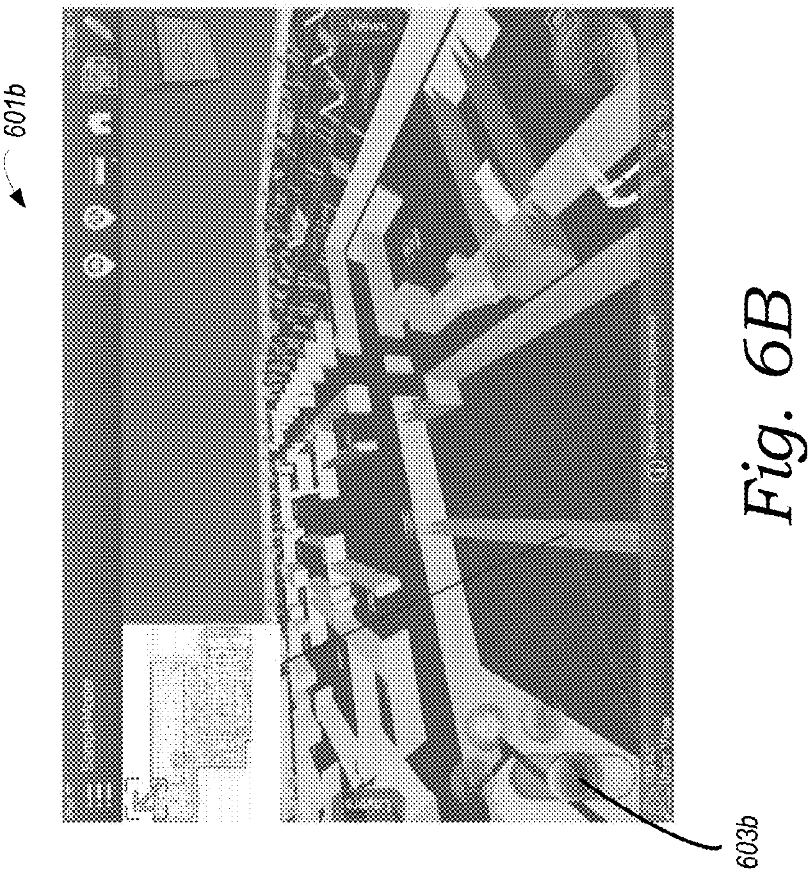
FIG. 6B depicts an example output of a computing device, in accordance with one embodiment of the present disclosure.
Figure 6A:
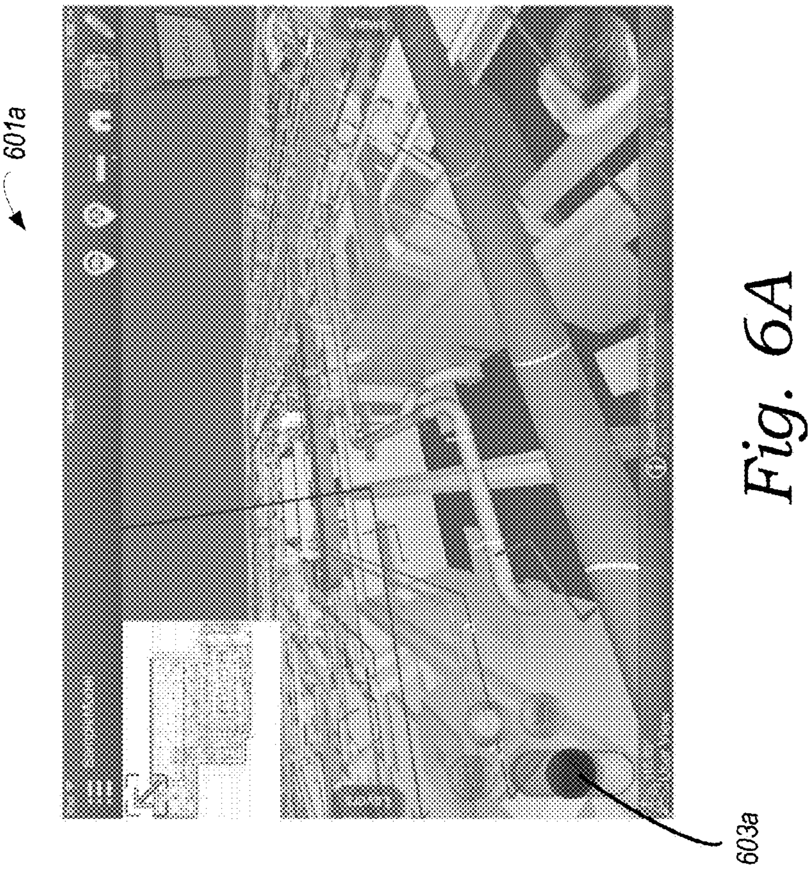
FIG. 6A depicts an example output of a computing device, in accordance with one embodiment of the present disclosure.

To illustrate this, FIGS. 6A and 6B depict example snapshots of a GUI that includes respective three-dimensional BIM views with invisible two-dimensional planes positioned at different respective clip heights. In particular, FIG. 6A depicts an example snapshot 601*a* that depicts a three-dimensional BIM view with an invisible two-dimensional plane positioned at a height of about nine feet. Accordingly, most of the meshes, including meshes depicting ceiling ductwork, are visible. FIG. 6B depicts an example snapshot 601*b* that depicts a similar three-dimensional BIM view as that depicted in FIG. 6A but with an invisible two-dimensional plane positioned at a lower height of about four feet. In accordance with the example implementation described above, several meshes, including meshes depicting ceiling ductwork as well portions of meshes depicting the walls, are not visible. It should be appreciated that in other implementations, the computing device may present a three-dimensional BIM in which the two-dimensional plane is visible within the three-dimensional view.

To further facilitate providing a graphical selection of the desired clip height, the computing device may be configured to move the invisible two-dimensional plane in response to receiving a user input. The computing device may facilitate this in any number of different ways.

As one possibility, the computing device may move the invisible two-dimensional plane in response to receiving a particular type of user input that is associated with moving the invisible two-dimensional plane, such as pressing an up or down arrow on a keyboard, scrolling the wheel of a mouse in a given direction, or inputting a touch and drag gesture in a given direction on a touch screen. For example, an upward touch and drag gesture may cause the computing device to reposition the invisible two-dimensional plane upward along the vertical axis of the three-dimensional BIM view while a downward touch and drag gesture may cause the computing device to reposition the invisible two-dimensional plane lower along the vertical axis of the three-dimensional BIM view.

While moving the invisible two-dimensional plane in response to receiving the given type of user input, the computing device may also update the three-dimensional BIM view based on the movement of the invisible two-dimensional plane. For instance, in the case where the invisible two-dimensional plane is moved upward along the vertical axis of the three-dimensional BIM view, the computing device may respond by updating the three-dimensional BIM view by bringing into view meshes or portions of meshes that lie below the new position of the invisible two-dimensional plane. In the case where the invisible two-dimensional plane is moved downward along the vertical axis of the three-dimensional BIM view, the computing device may respond by removing from view meshes or portions of meshes that lie above the new position of the invisible two-dimensional plane.

As another possibility, the GUI presented by the computing device may include a navigational interface element through which a user may provide a user input that causes the computing device to move the invisible two-dimensional plane, in which case the computing device may move the invisible two-dimensional plane in response to user interaction with this navigational interface element. In one example of this, the navigational interface element may be a virtual joystick, such as joystick 603*a* in FIG. 6A or joystick 603*b* in FIG. 6B, that a user can touch and drag in an upward or downward direction. In this example, when the computing device receives a user input that drags the joystick in the upward direction, the computing device may responsively move the invisible two-dimensional plane upward along the vertical axis of the three-dimensional BIM view. Likewise, when the computing device receives a user input that drags the joystick in the downward direction, the computing device may responsively move the invisible two-dimensional plane downward along the vertical axis of the three-dimensional BIM view. When the user releases the joystick, the computing device may stop moving the invisible two-dimensional plane.

Once the invisible two-dimensional plane is in the desired position, the computing device may receive a confirmation that the invisible two-dimensional plane is in the desired position, such as by receiving a user selection of an "Enter" key on a keyboard, a mouse click, or a tap on the screen, among other possibilities.

The indication of the desired clip height at which to generate the two-dimensional technical drawing may take various other forms and be received by the computing system in various other manners as well.

Returning to FIG. 5, at block 504, the computing device identifies, from the set of meshes included in the BIM file, a given subset of meshes that intersect with a two-dimensional plane at the desired clip height. The computing device may perform this identification operation in various manners.

In one implementation, the computing device searches through the data defining the set of meshes included in the BIM file and identifies meshes that have at least one triangle that intersects with the two-dimensional plane. For any mesh that has at least one triangle that intersects with the two-dimensional plane, the computing device may then add that mesh to the given subset of meshes.

Depending on the size of the construction project, and thus the size of the BIM file, searching through the data defining the set of meshes included in the BIM file could take considerable time and computing resources, particularly in cases where the BIM file contains data defining many hundreds or thousands of meshes and thus data defining perhaps hundreds of thousands of triangles. Thus, in another implementation, the computing device may be configured to (1) reduce the data set within which the computing device searches for meshes that intersect with the two-dimensional plane by identifying a first subset of meshes that have a bounding box that intersects with the two-dimensional plane and then (2) from among this first subset of meshes, identify a second subset of meshes that contain at least one triangle that intersects with the two-dimensional plane. By first narrowing the subset of meshes to just those that have a bounding box that intersects with the two-dimensional plane, and then searching through this subset, the computing device may reduce and thereby conserve processing power that may be used to perform this operation, resulting in a more efficient and perhaps faster process.

At block 506, for each respective mesh in the given subset of meshes that is determined to be intersecting with the two-dimensional plane, the computing device determines the portion of the respective mesh that intersects with the two-dimensional plane. The computing device may perform this identification operation in various manners.

In one implementation, each respective mesh in the given subset of meshes may be comprised of a respective set of triangles, and geometrically, and an intersection between the two-dimensional plane and a triangle may be defined by a line segment connecting two coordinates at this intersection. In this respect, the computing device may determine the portion of a mesh that intersects with the two-dimensional plane by (1) identifying the coordinates of each line segment formed as a result of the two-dimensional plane intersecting with each triangle of the respective mesh and (2) combining the line segments together to form a two-dimensional shape thereby defining the portion of the mesh that intersects with the two-dimensional plane. However, the computing device may determine the portion of the respective mesh that intersects with the two-dimensional plane in various other manners as well.

Further, the data defining the portions of a mesh that intersect with the two-dimensional plane may take various forms. In one example, this data may comprise a set of x-y coordinates, where each set of x-y coordinates represents the end points of a line segment formed as a result of an intersection between a respective triangle of a mesh and the two-dimensional plane. In another example, this data may comprise a set comprise x-y-z coordinates; but the z-coordinate can often be omitted in practice because the coordinates in the set will have the same z-coordinate. The data defining the portions of a mesh that intersect with the two-dimensional plane may take other various forms as well.

At block 508, the computing device may then compile a dataset that defines a two-dimensional drawing based on the determined portions of meshes that intersect with the two-dimensional plane. In one implementation, the computing device may compile the dataset defining the two-dimensional drawing by generating data defining respective line segments that represent the various portions of meshes that intersect with the two-dimensional plane, such that when the respective line segments are arranged on a two-dimensional display, they depict a two-dimensional view of the construction project at the desired clip height. The computing device may also include within this dataset data indicating an association between the line segments and the respective meshes represented by the line segments. For instance, each line segment in the dataset represents a particular mesh from the BIM file. Accordingly, for each line segment in the compiled dataset, the computing device may generate data describing the association between that line segment and the particular mesh from which the line segment was determined.

At block 510, the computing device may render a two-dimensional drawing using the compiled dataset. In one implementation of this, the computing device arranges the various line segments defined by the compiled dataset in a two-dimensional view and presents this view via a display interface of the computing device.

Figure 7:
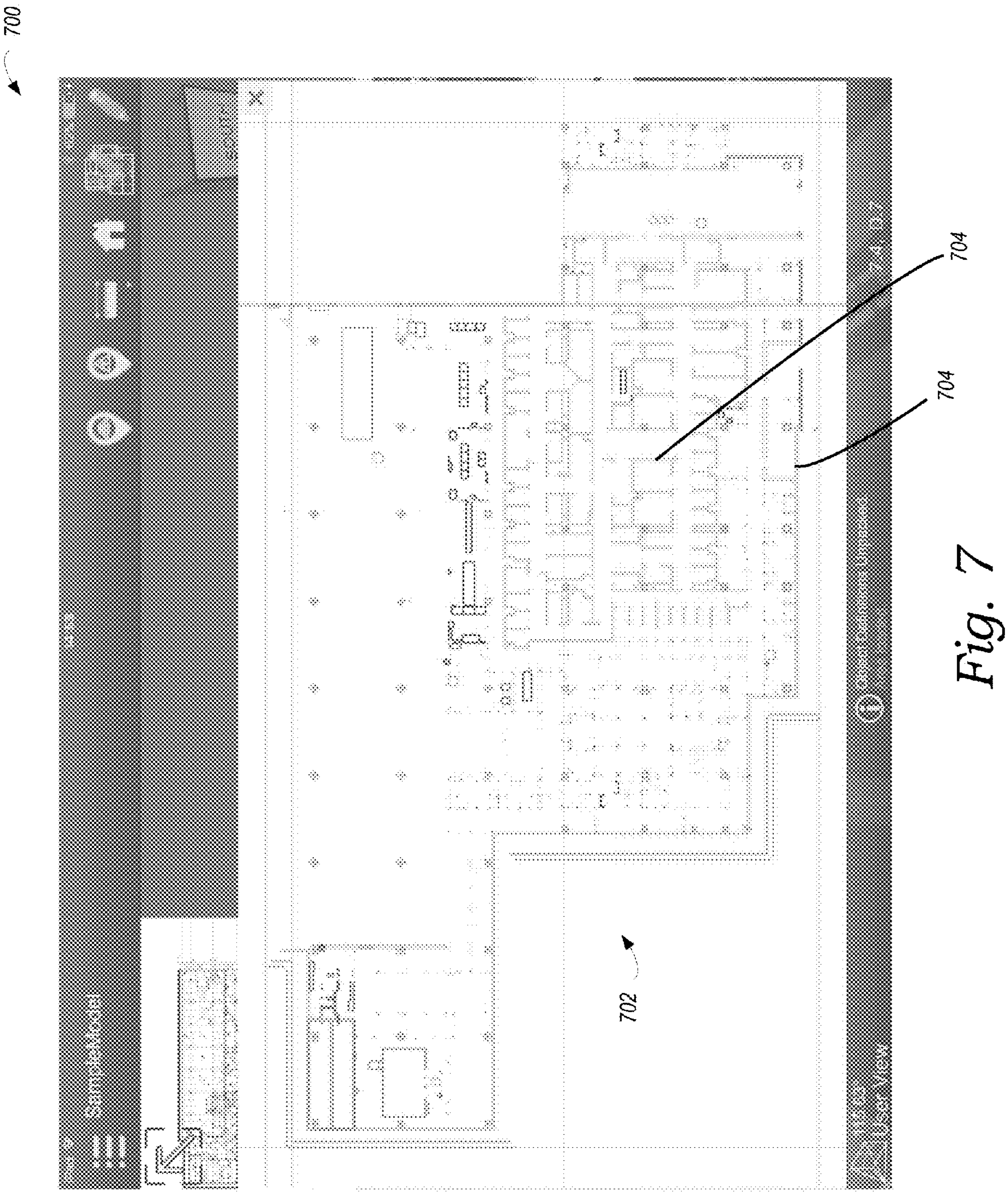
FIG. 7 depicts an example output of a computing device, in accordance with one embodiment of the present disclosure.

To illustrate an example of this, FIG. 7 depicts an example snapshot 700 of a GUI that includes a view of a two-dimensional drawing 702 generated by the computing device in accordance with the above operations. As depicted, two-dimensional drawing 702 includes several line segments that represent portions of meshes that intersect with a two-dimensional plane at a desired clip height as depicted in FIG. 6B. Among others, these line segments include line segments 704, which represent portions of meshes that represent walls in the construction project.

The computing device may be configured to adjust the display based on user input received at the computing device. For instance, as one possibility, in response to receipt of a user input selecting one of the particular line segments of the two-dimensional drawing (e.g., by a tap of one of the lines on a touch-screen interface or by positioning a mouse cursor over a line and then clicking the mouse), the computing device may refer to the compiled dataset to determine with which mesh the particular line segment is associated. Once determined, the computing device may then display some or all of the metadata associated with the determined mesh (e.g., what material the physical element represented by the mesh is made of, where the physical element represented by the mesh is located, and/or a part or model number of the physical element represented by the mesh).

As another possibility, the computing device may be configured to alternate between presenting the two-dimensional drawing and presenting a three-dimensional BIM view. In one specific example of this, the computing device may present the two-dimensional drawing via a display interface of the computing device and in response to receipt of a user input selecting one of the particular line segments of the two-dimensional drawing (e.g., by a tap of one of the line segments on a touch-screen interface or by positioning a mouse cursor over a line segment and then clicking the mouse), the computing device may refer to data in the compiled dataset describing the association between the line segment and a particular mesh and thereby determine the mesh with which the particular line segment is associated. Once determined, the computing device may present a three-dimensional BIM view and orient the perspective of the three-dimensional BIM view so as to bring the particular mesh into view.

The computing device may present additional information on the two-dimensional drawing as well, including dimension information, such as indications of the length of particular line segments or the distance between two or more line segments. In another example, the computing device may add in labels for the particular line segments, such as "conference room wall" or "air register return." Other examples are possible as well.

B. Generating a Functional Inset

In another aspect, the disclosed software tool may cause a computing device to carry out a process for creating a more functional, two-dimensional inset within a three-dimensional view of a construction project.

As mentioned, some BIM viewer software may display an inset (usually in the top left or top right corner of the screen) when displaying a three-dimensional BIM view. Returning to FIG. 4, depicted therein an example inset 406 positioned in the upper left corner of snapshot 400, although other examples of insets are possible. Generally, an inset provides a top-down view of the entire construction project as well as perhaps a rough indication of where within the construction project the current point of view of the three-dimensional BIM view is located. As depicted on inset 406, for instance, an indicator 408 is included that indicates the rough position within the inset at which the current point of view is located.

However, this inset tends to not be as functional as may be desired. For instance, in some cases, the inset is created by the person or people who generated the BIM file, and as such, may simply be an outline that displays the outer walls of a project, but no inner walls or other detail. As such, the inset may not provide a precise indication of where within the construction project the current point of view is located. And given that the inset typically displays just a rough outline of the construction project, use of the inset to navigate about the three-dimensional BIM view tends not be accurate as well. For instance, in implementations where BIM viewer software is configured to reposition the current point of view of the three-dimensional BIM view based on a user input (such as a tap) received at the inset, navigating by tapping the inset tends not to be accurate. For instance, a user that desires to navigate the three-dimensional BIM view by tapping the inset to bring a particular room of the construction project into view may have to guess where that room is located in the inset because the internal walls of the construction project are not displayed.

In view of this drawback, some software tools offer an alternative to using the inset designed by the person or people who generated the BIM file, and are instead configured to use an external two-dimensional technical drawing as the inset (e.g., a PDF of an architectural plan). Such software tools may facilitate this by shrinking the PDF down and positioning it in the corner of the user interface. But this has certain drawbacks as well. For instance, using an external two-dimensional technical drawing as an inset typically removes the ability to interact with the inset to navigate. In essence, the inset becomes merely a reference without any navigational functionality. Further, two-dimensional technical drawings may not have the ability to use an indicator to indicate the position of the point of view of the three-dimensional BIM view.

The disclosed software tool improves upon this existing technology for presenting a two-dimensional inset within a three-dimensional view of a construction project, by enabling a computing device to carry out a process for generating a two-dimensional inset based on an external two-dimensional technical drawing file and a BIM file. This process may take various forms.

Figure 8A:
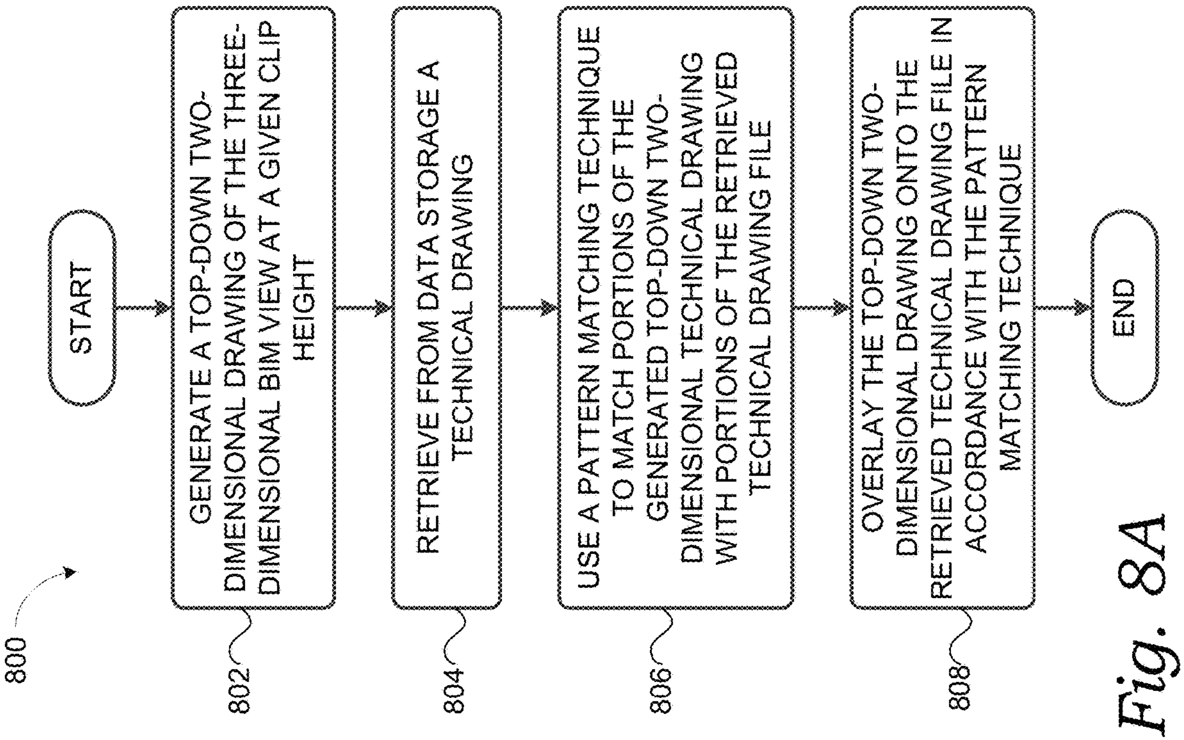
FIG. 8A is a flow diagram depicting example operations for generating a functional inset, according to one embodiment of the present disclosure.
Figure 8B:
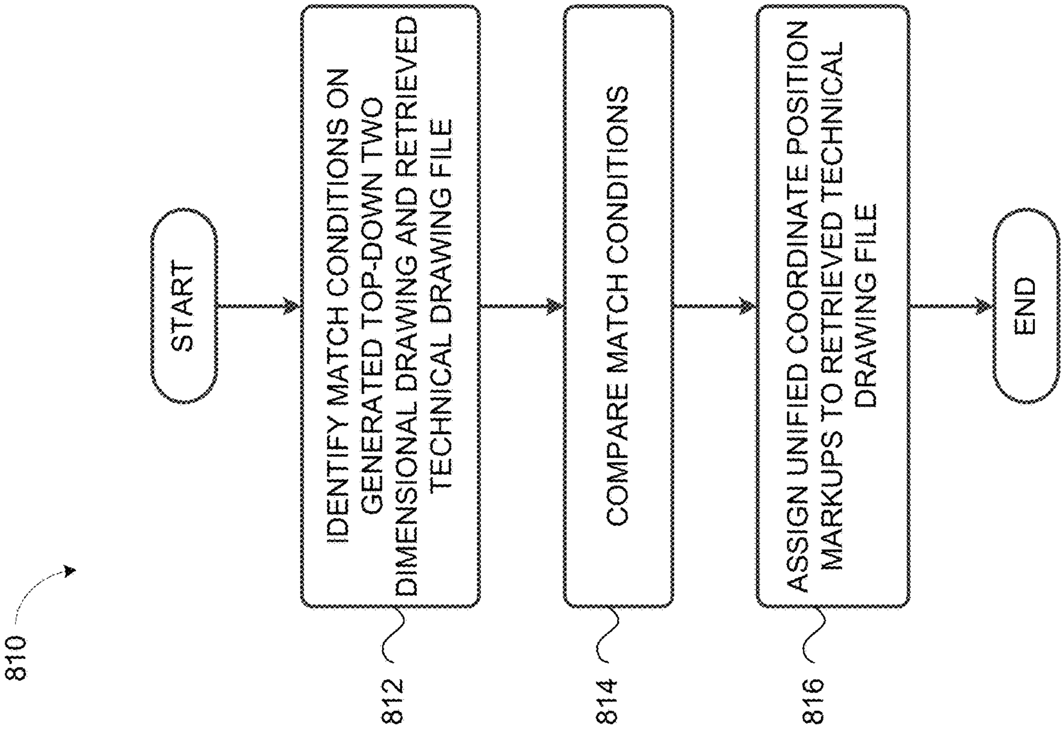
FIG. 8B is a flow diagram depicting example operations for engaging in a pattern matching technique, according to one embodiment of the present disclosure.

With reference now to flow diagram 800 of FIG. 8A, one example of a process carried out in accordance with the disclosed software tool for generating a two-dimensional inset based on an external two-dimensional technical drawing file and a BIM file is illustrated and described. In practice, this process may be commenced while the computing device is presenting a three-dimensional BIM view via a GUI. In some implementations, for instance, the computing device may receive an indication that a user has requested creation of a functional inset, such as the push of a button or the selection of a menu command. However, other ways to commence the process are possible as well.

Once the process is commenced, the process may generally involve the following operations: (i) at block 802, the computing device generates a top-down, two-dimensional drawing of the three-dimensional BIM view at a given clip height, (ii) at block 804, the computing device may retrieve from data storage a technical drawing file, (iii) at block 806, the computing device may use a pattern matching technique to match portions of the generated top-down two-dimensional drawing with portions of the retrieved technical drawing file, and (iv) at block 808, the computing device overlays the top-down two-dimensional drawing onto the retrieved technical drawing file in accordance with the results of the pattern matching to thereby create a functional inset. Each of these operations will now be discussed in further detail.

At block 802, the computing device generates a top-down two-dimensional drawing of the three-dimensional BIM view at a given clip height. In one implementation, the computing device generates the top-down two-dimensional technical drawing by engaging in a process similar to that described above with respect to flow diagram 500 in FIG. 5, with the caveat that the given clip height may either be determined based on user input (as described above) or may be predefined in the software as a default clip height value (e.g., four feet). However, the computing device may generate a top-down two-dimensional drawing of the three-dimensional BIM view at a given clip height using other techniques as well.

The top-down two-dimensional drawing generated in block 802 may have similar functionality as the two-dimensional drawing generated as a result of the process described above with respect to flow diagram 500 in FIG. 5. For instance, the top-down two-dimensional drawing generated in block 802 may comprise various line segments representing various meshes in the BIM file. As such, the top-down two-dimensional drawing may be arranged such that when the computing device receives a user input selecting one of the line segments of the top-down two-dimensional drawing (e.g., by a tap of one of the lines on a touch-screen interface or by positioning a mouse cursor over a line and then clicking the mouse), the computing device may be configured to display some or all of the metadata associated with the determined mesh (e.g., what material the physical element represented by the mesh is made of, where the physical element represented by the mesh is located, and/or a part or model number of the physical element represented by the mesh). Further, the computing device may configured to adjust the presentation of a three-dimensional BIM view based on a user input selecting one of the line segments of the top-down two-dimensional drawing. Specifically, in response to receipt of a user input selecting one of the particular line segments of the top-down two-dimensional drawing (e.g., by a tap of one of the line segments on a touch-screen interface or by positioning a mouse cursor over a line segment and then clicking the mouse), the computing device may present a three-dimensional BIM view and orient the perspective of the three-dimensional BIM view such that the mesh represented by the particular line segment is in depicted in the three-dimensional BIM view. Other functionality is possible as well.

At block 804, the computing device may retrieve from data storage a technical drawing file, such as a CAD drawing or an architectural plan that exists in electronic form (e.g., PDF). For instance, as one possibility, the computing device may retrieve the technical drawing file in response to receiving a user input directing the computing device to the location in data storage of the technical drawing file. However, other ways of retrieving a technical drawing file from data storage are possible as well.

At block 806, the computing device may use a pattern matching technique in order to match portions of the generated top-down two-dimensional drawing with portions of the retrieved technical drawing file. For example, the computing device may engage in a technique where it attempts to align the lines of the generated top-down two-dimensional technical drawing with lines on the retrieved technical drawing file. At a high level, this may involve rotating and/or resizing the top-down two-dimensional technical drawing until it substantially matches the retrieved technical drawing file. Other ways to engage in pattern matching techniques are possible as well.

To help illustrate one example of how a computing device may use a pattern matching technique in order to match portions of the generated top-down two-dimensional drawing with portions of the retrieved technical drawing file, reference will now be made to an additional flow diagram 810 depicting an example process for using a pattern matching technique in order to match portions of the generated top-down two-dimensional drawing with portions of the retrieved technical drawing file. This process may generally involve the following operations: (i) at block 812, the computing device identifies match conditions on the generated top-down two-dimensional drawing and the retrieved technical drawing file, (ii) at block 814, the computing device compares the match features identified at block 812 in order to appropriately scale and align the respective drawings, and (iii) at block 816, the computing device may next assign unified coordinate position markups to the retrieved technical drawing file. Each of these operations will now be discussed in further detail.

It should be understood, however, that although this example process is described with reference to using a generated top-down two-dimensional drawing (e.g., at block 812 by identifying match conditions on the generated top-down two-dimensional drawing and the retrieved technical drawing file), a computing device may engage in the disclosed pattern matching technique by using two-dimensional drawings other than generated top-down two-dimensional drawings. For instance, a computing device engaging in the disclosed pattern matching technique may use a traditional two-dimensional CAD drawing or other two-dimensional technical drawing file instead of a generated top-down two-dimensional drawing file.

Turning first to block 812, the computing device identifies match conditions on the generated top-down two-dimensional drawing and the retrieved technical drawing file. As described, the generated top-down two-dimensional drawing may be similar to the technical drawing generated in the manner described above with respect to flow diagram 500 in FIG. 5, and the retrieved technical drawing file may be similar to the examples described above with respect to block 804 in flow diagram 800 in FIG. 8A (e.g., a CAD drawing or an architectural plan that exists in electronic form, such as in PDF form).

Figure 9B:
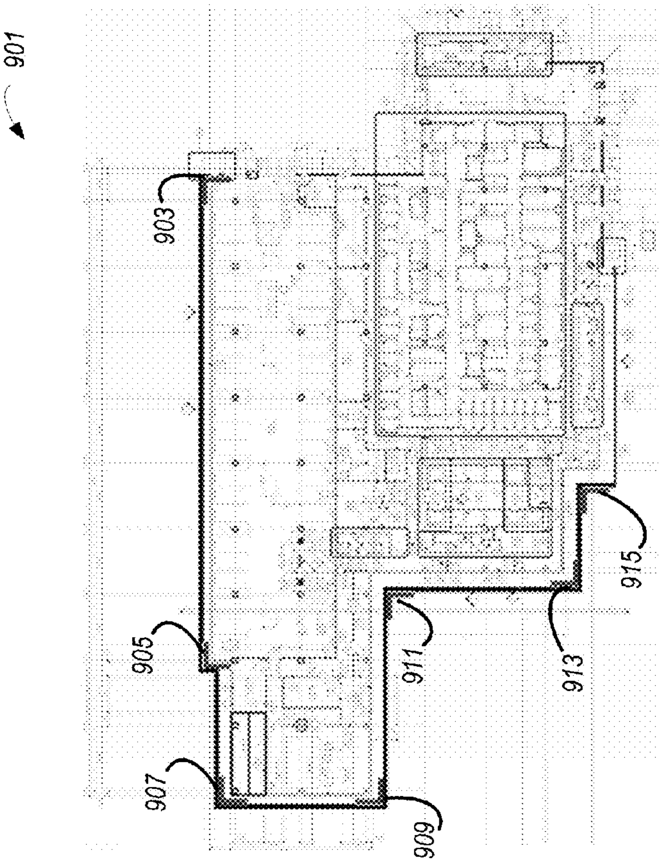
FIG. 9B depicts an example output of a computing device, in accordance with one embodiment of the present disclosure.
Figure 9A:
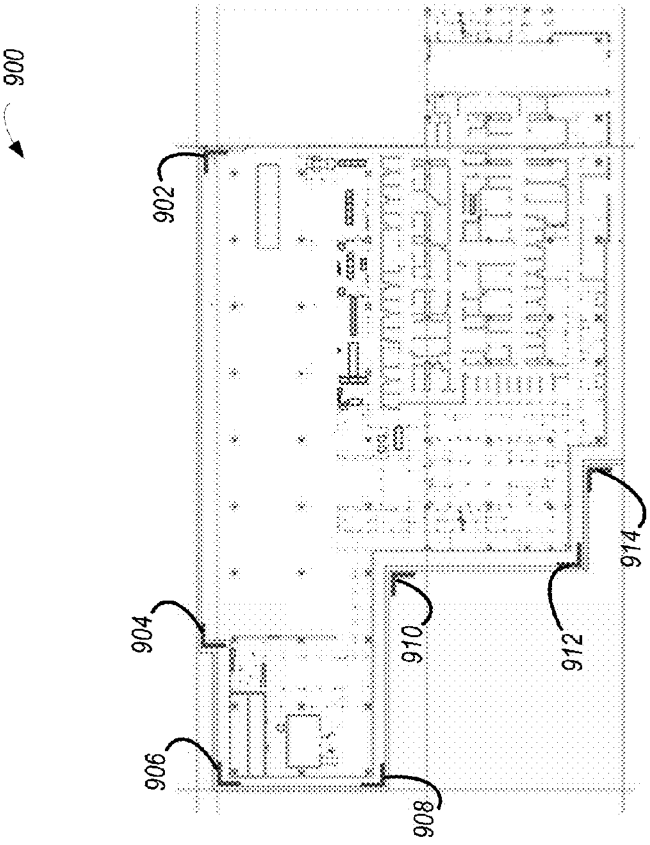
FIG. 9A depicts an example output of a computing device, in accordance with one embodiment of the present disclosure.

As a general matter, match conditions are certain identifiable features of a technical drawing-including, for instance, gridlines, convex or concave corners, other primitive shapes in the drawing, or distances between such shapes—that the computing device may use to compare two different drawings. In accordance with one example of identifying match features on a generated top-down two-dimensional drawing and a retrieved technical drawing file, the computing device may identify one or more convex or concave corners of each drawing and mark each corner with a point. To illustrate, FIG. 9A depicts a generated top-down two-dimensional drawing 900 and FIG. 9B depicts a retrieved technical drawing 901. In accordance with the example mentioned above, the computing device may identify the convex or concave corners 902, 904, 906, 908, 910, 912 and 914 on generated top-down two-dimensional drawing 900 and mark each corner with a respective point. Similarly, the computing device may identify the convex or concave corners 903, 905, 907, 909, 911, 913, and 915 on retrieved technical drawing 901 and mark each corner with a respective point. In this way, the collection of points created as a result of identifying match features on each of the generated top-down two-dimensional drawing and the retrieved technical drawing file forms a respective point cloud (i.e., a first point cloud associated with the identified match features on the generated top-down two-dimensional drawing, and a second point cloud associated with the identified match features on the retrieved technical drawing file). Other ways of identifying match conditions on the generated top-down two-dimensional drawing and the retrieved technical drawing file are possible as well.

At block 814, the computing device compares the match features identified at block 812 in order to appropriately scale and align the respective drawings. In one example of this, the computing device uses the respective point clouds (e.g., the first and second point clouds, which were generated as a result of identifying the match features of each drawing) to align and scale the respective drawings. For instance, the computing device may utilize a best-fit algorithm-such as a least-squares technique, a computer-vision technique, or a combination of a the least-squares technique and the computer-vision technique—in order to arrive at one or more best fit solutions in which the first point cloud is aligned with the second point cloud. In general, the best-fit solution will be the alignment in which the highest percentage of match features identified on the generated top-down two-dimensional drawing and the retrieved technical drawing are aligned. In cases in which there is a single best-fit solution, the computing device may accept this solution and proceed to the next step. However, in cases in which there are multiple best-fit solutions, the computing device may analyze each possible best-fit solution using a combination of a machine learning technique and a computer vision technique to narrow the possible best-fit solutions to a single best-fit solution. The computing device may then accept this best-fit solution and proceed to the next step.

At block 816, with the first point cloud aligned with the second point cloud, and thus the retrieved technical drawing aligned with the generated top-down two-dimensional drawing, the computing device may next assign "a unified coordinate system" to the retrieved technical drawing file.

For instance, as explained above with respect to flow diagram 500 of FIG. 5, for the generated top-down two-dimensional drawing, the computing device compiled a dataset that defines this drawing with data representing the respective line segments of the drawing. On a more granular level, this data may be represented by coordinates that define the respective line segments of the drawing with respect to an overall coordinate system utilized by the underlying BIM file (referred to herein as "a unified coordinate system" or "the unified coordinate system"). By contrast, the data contained on the original retrieved technical drawing file (e.g., the line segments of the technical drawing and so forth) may be represented by coordinates that define this data with respect to the pixel dimensions of the drawing. In accordance with the functionality set forth here at block 816, the computing device may associate the coordinate data defined in the retrieved technical drawing with the unified coordinate system (by creating a mapping between the two coordinates, and/or by changing the coordinates of the retrieved file to the unified system, among other possibilities). The computing device may do this by (i) referring to various portions of the top-down generated two-dimensional drawing, (ii) retrieving the unified coordinate data that defines these portions with respect to the unified coordinate system, and (iii) applying the same unified coordinate data to corresponding portions of the retrieved technical drawing. Other ways of assigning a unified coordinate system to the retrieved technical drawing file are possible as well.

When the pattern matching is complete and the coordinate systems have been mapped to each other, data input on one drawing may be readily associated with another drawing. For example, if markup information (e.g., a "request for information" (RFI), an observation, a punch item, etc.) is added to one drawing (for example by a construction professional using Procore's drawing tool), that markup information may be mapped to and added to a corresponding location on another drawing. For instance, if a user associates RFI data with a location of a technical drawing file, in accordance with the forgoing process this RFI information may be associated with and mapped to a corresponding location in other drawing files, such as top-down two-dimensional drawings generated from the underlying BIM file. By doing so, when construction professionals update the RFI information in a given drawing file, (e.g., by using a drawing tool provided by Procore), the update can be reflected on each additional drawing that may become associated with the given drawing file. It should be understood that such updates may also be added/reflected in the underlying BIM file as well. Accordingly, construction professionals that utilize a multitude of different software tools to access the underlying BIM file can have access to consistent information.

Returning to FIG. 8A, at block 808A, once pattern matching is complete, the computing device overlays the top-down two-dimensional drawing onto the retrieved technical drawing file in accordance with the pattern matching technique to thereby create a functional inset. In some implementations of this, the computing device overlays the top-down two-dimensional drawing but hides the lines of the generated drawing from view. In this way, just the lines from the two-dimensional drawing file (e.g., the PDF CAD file) are visible, but functionality associated with the top-down two-dimensional drawing subsists.

As explained above, the computing device generates the top-down two-dimensional drawing by engaging in a process similar to that described above with respect to flow diagram 500 in FIG. 5. As such, the computing device may store a similar association between the lines of the top-down two-dimensional drawing and the meshes in the BIM file that are represented by these lines. In this way, the computing device may be similarly configured to respond to user inputs received at or near a particular line of the top-down two-dimensional drawing by displaying additional data associated with the mesh represented by the particular line.

For instance, in response to receipt of a user input selecting a specific area of the functional inset (e.g., by a tap on a touch-screen interface or by positioning a mouse cursor over the inset then clicking the mouse), the computing device may recognize the user input as selecting the specific area of the top-down two-dimensional drawing, which was overlaid on the drawing file (but hidden from view) to form the functional inset. If the specific area includes a line segment, the computing device may then refer to the data describing the association between the line segment and a particular mesh to identify the particular mesh with which the line segment is associated. Once determined, the computing device may then display some or all of the metadata associated with the particular mesh (e.g., what material the physical element represented by the mesh is made of, where the physical element represented by the mesh is located, and/or a part or model number of the physical element represented by the mesh). As another possibility, the computing device may adjust the display of the three-dimensional BIM view in order to orient the point of view of the three-dimensional BIM view such that the particular mesh is visible. However, other responsive actions are possible as well.

C. Generating Dimension Views

In yet another aspect, the disclosed software tool may cause a computing device to use a BIM file as a basis for generating additional dimensioning information related to a construction project, such as dimensioning information relating to one or more physical elements (e.g., the distance between two ducts, or the distance between a ceiling and a pipe), which may not be expressly specified in any available two-dimensional technical drawing or readily discernible from any three-dimensional BIM view.

Figure 10:
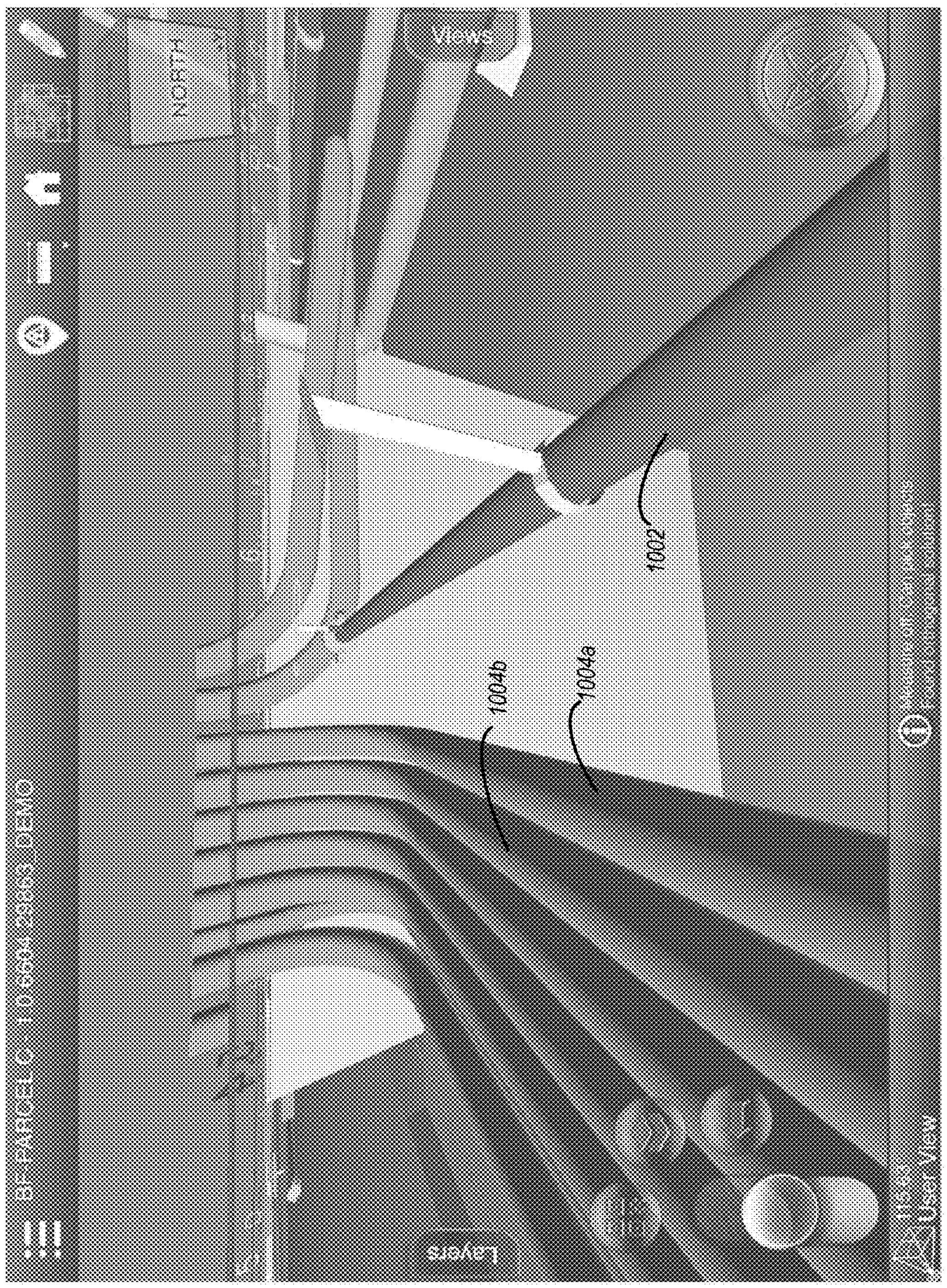
FIG. 10 depicts an example output of a computing device, in accordance with one embodiment of the present disclosure.

For example, consider the example construction project scenario where construction plans may call for a collection of multiple pipes to run parallel to a floor. An ordinary two-dimensional technical drawing, such as a blueprint, may not indicate the distance between each pipe. Moreover, a three-dimensional BIM view may provide a view of the collection of pipes from various angles and may be operable to display information about each individual pipe, such as the dimensions and material of each pipe. But perhaps no three-dimensional BIM view or any other specification document indicates the distance between each pipe. To illustrate this example scenario, FIG. 10 depicts an example snapshot 1000 of a GUI, which includes a three-dimensional view of a construction project rendered at a particular perspective. As depicted in snapshot 1000, the construction project includes a cluster of several pipes, including pipes 1002, 1004*a*, and 1004*b*. And as also depicted, this particular three-dimensional view provides no indication specifying dimension information for pipes 1002, 1004*a*, and 1004*b*. When a construction professional desires this information, the construction professional would typically derive it based on his or her own calculation, accounting for, among other things, the known dimension of an individual pipe, the total number of pipes in the collection, how far the first pipe is from the near wall, and how far the last pipe is from the far wall.

The disclosed software tool improves upon this existing approach for deriving dimensioning information, by enabling a computing device to carry out a process that uses a BIM file and a custom area of interest defined by using a three-dimensional BIM view to generate a custom two-dimensional view containing dimensioning information, which may be referred to hereinafter as a dimension view. This process may take various forms.

Figure 11:
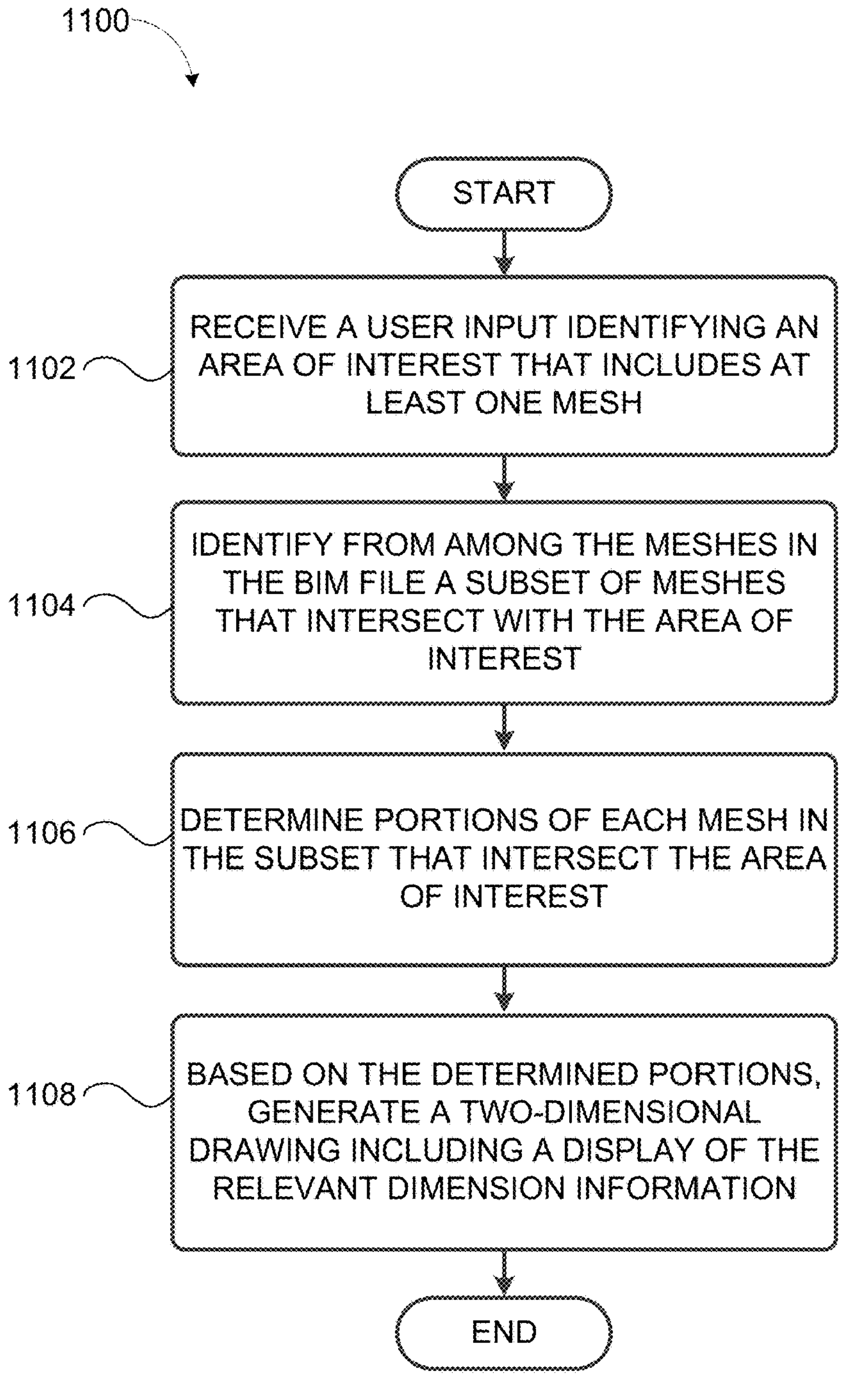
FIG. 11 is a flow diagram depicting example operations for generating a two-dimensional dimension view, according to one embodiment of the present disclosure.

With reference now to flow diagram 1100 of FIG. 11, one example of a process carried out in accordance with the disclosed software tool for generating a custom two-dimensional view containing dimensioning information is illustrated and described. In practice, this process is typically commenced while the computing device is displaying a three-dimensional BIM view via a GUI. In some implementations, for instance, the computing device may receive an indication from the user requesting the creation of a dimension view, such as the push of a button or the selection of a menu command. However, other ways to commence the process are possible as well.

Once the process is commenced, the process generally involves the following operations: (i) at block 1102, the computing device receives a user input identifying an area of interest that includes at least one mesh, (ii) at block 1104, the computing device identifies from among the meshes in the BIM file a subset of meshes that intersect with the area of interest, (iii) at block 1106, the computing device determines the portions of the meshes that intersect with the area of interest, and (iv) at block 1108, the computing device generates a two-dimensional drawing including a display of relevant dimensioning information based on the determined portions. Each of these operations will now be discussed in further detail.

Figure 12A:
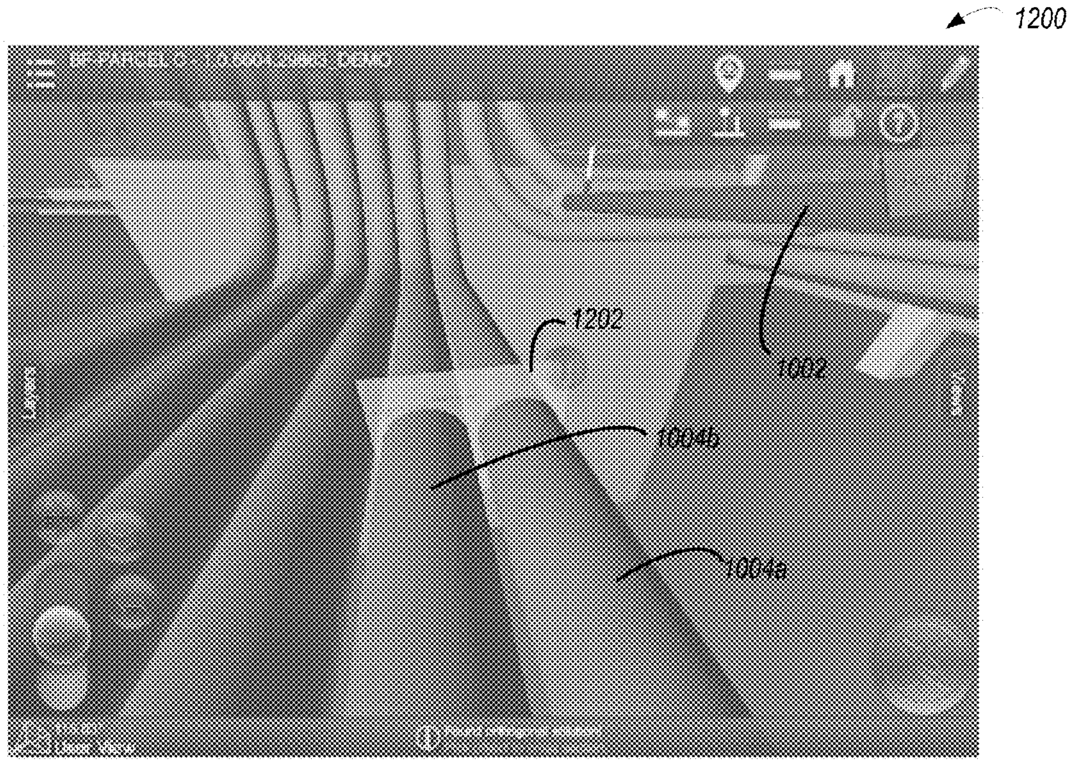
FIG. 12A depicts an example output of a computing device, in accordance with one embodiment of the present disclosure.
Figure 13A:
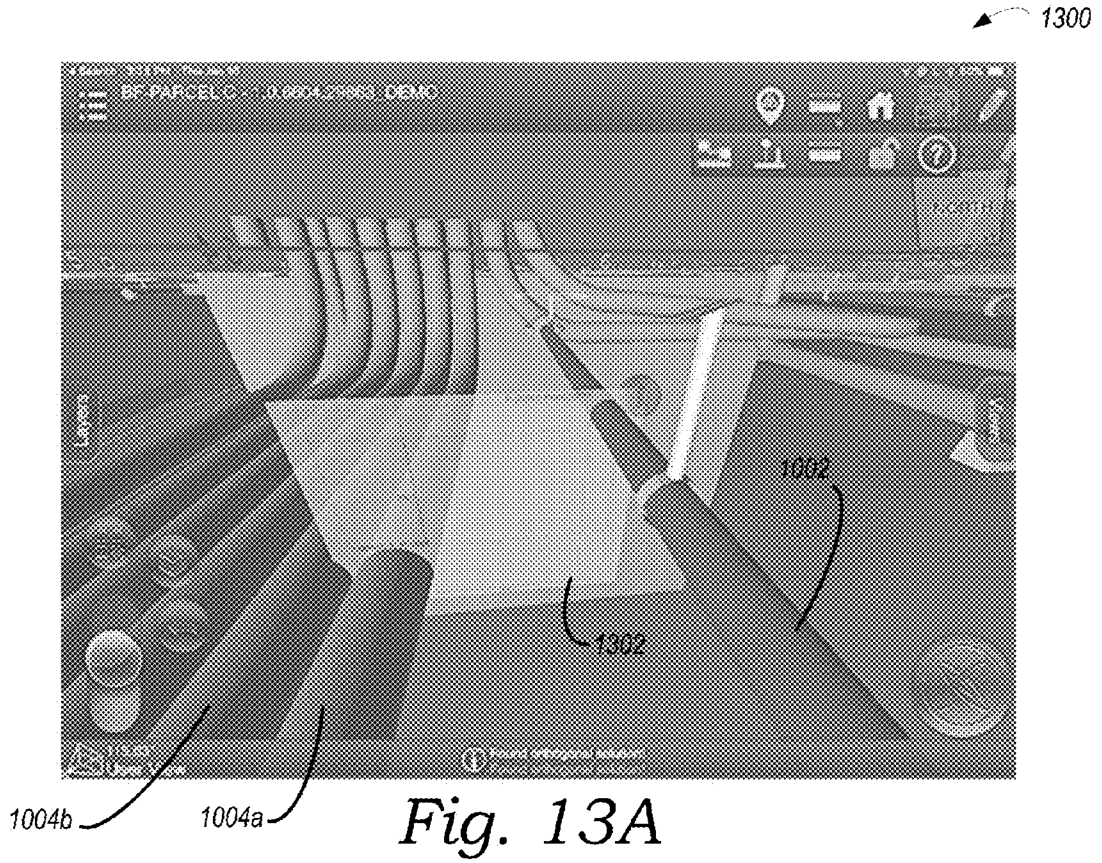
FIG. 13A depicts an example output of a computing device, in accordance with one embodiment of the present disclosure.

At block 1102, while the computing device is presenting a three-dimensional BIM view rendered using a BIM file, the computing device may receive a user input that identifies an area of interest containing at least one mesh. In one implementation of this, the computing device may receive a user input, such as a touch and drag, and responsively generate a two-dimensional plane on the GUI. To help illustrate this, FIG. 12A depicts an example snapshot 1200 of a GUI, which includes a three-dimensional view of the construction project depicted in snapshot 1000 (FIG. 10). Further depicted in snapshot 1200 is an example two-dimensional plane 1202, which may be rendered and displayed by the computing device at the commencement of the process. Additionally, FIG. 13A depicts another example snapshot 1300 of a GUI, which includes a three-dimensional view of the construction project depicted in snapshot 1000 (FIG. 10). Further depicted in snapshot 1300 is an example two-dimensional plane 1302, which may be rendered and displayed by the computing device at the commencement of the process.

The computing device may be configured to reposition the two-dimensional plane 1202 and/or the two-dimensional plane 1302 by rotating it, resizing it, or repositioning it along one or more of the three axes of the three-dimensional BIM view based on receipt of a respective user input, such as a touch and drag, among others. Once the two-dimensional plane 1202 and/or the two-dimensional plane 1302 is in a desired position (which, in the example depicted by FIG. 12A, may be a position that intersects, and is perpendicular to, pipes 1004*a* and 1004*b*, and in the example depicted by FIG. 13A, may be a position that intersects, and is perpendicular to, pipes 1004*a* and 1002), the computing device may receive a confirmation that the area of interest is located in the desired location. In one implementation of this, the computing device receives an indication that the two-dimensional plane is in the desired location, by, for instance, receiving a user input, such as a tap or mouse click.

At block 1104, the computing device may identify from among the meshes in the BIM file a subset of meshes that intersect with the area of interest. In one implementation, the computing device identifies meshes that intersect with the area of interest (e.g., two-dimensional plane 1202 and/or 1302) using a process similar to that described above with respect to flow diagram 500 in FIG. 5. That process is described in further detail above with respect to flow diagram 500 and, for brevity's sake, is not repeated again here in detail. As general matter, however, the process includes, in one implementation, the computing device identifying a first subset of meshes that have a bounding box that intersects with the two-dimensional plane, and from among this first subset of meshes, identifying a second subset of meshes that contain at least one triangle that intersects with the two-dimensional plane. Referring back to FIG. 12A, in this example the computing device may determine that the area of interest intersects with pipes 1004*a* and 1004*b*, and thus the computing device may identify the meshes associated with pipes 1004*a* and 1004*b*. And in the example depicted by FIG. 13A, the computing device may determine that the area of interest intersects with pipes 1004*a* and 1002 and thus the computing device may identify the meshes associated with pipes 1004*a* and 1002.

Figure 12B:
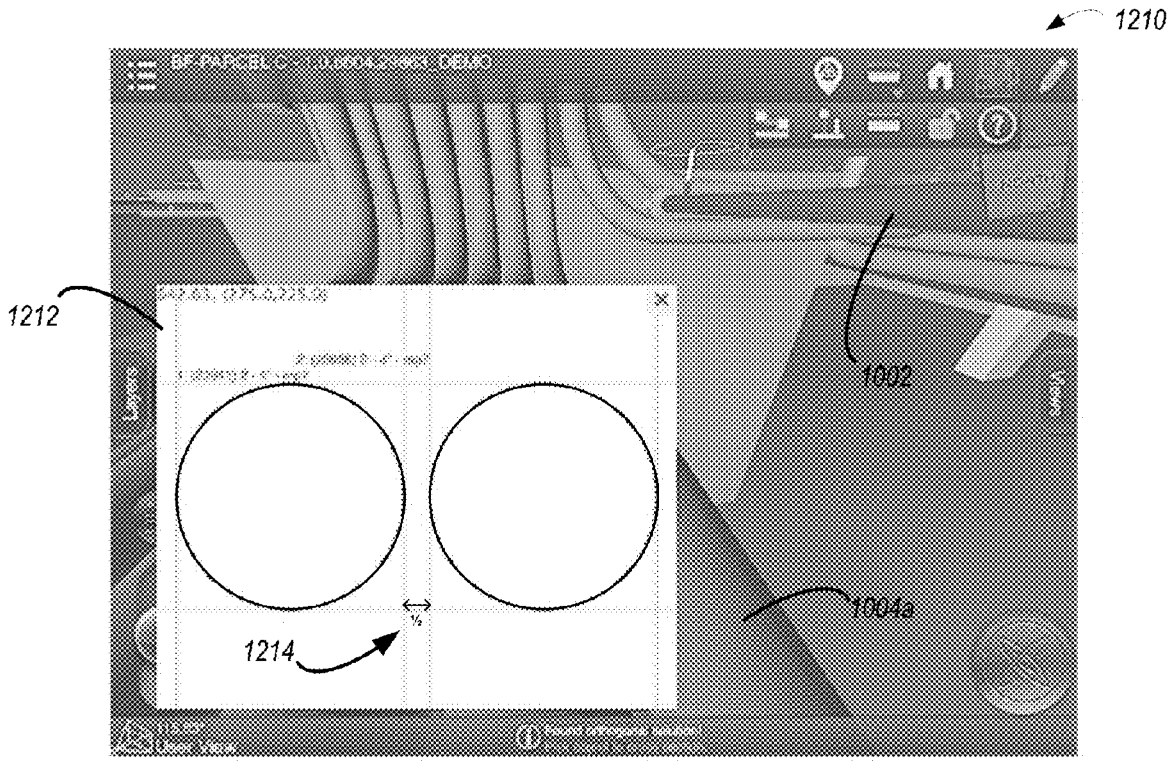
FIG. 12B depicts an example output of a computing device, in accordance with one embodiment of the present disclosure.
Figure 13B:
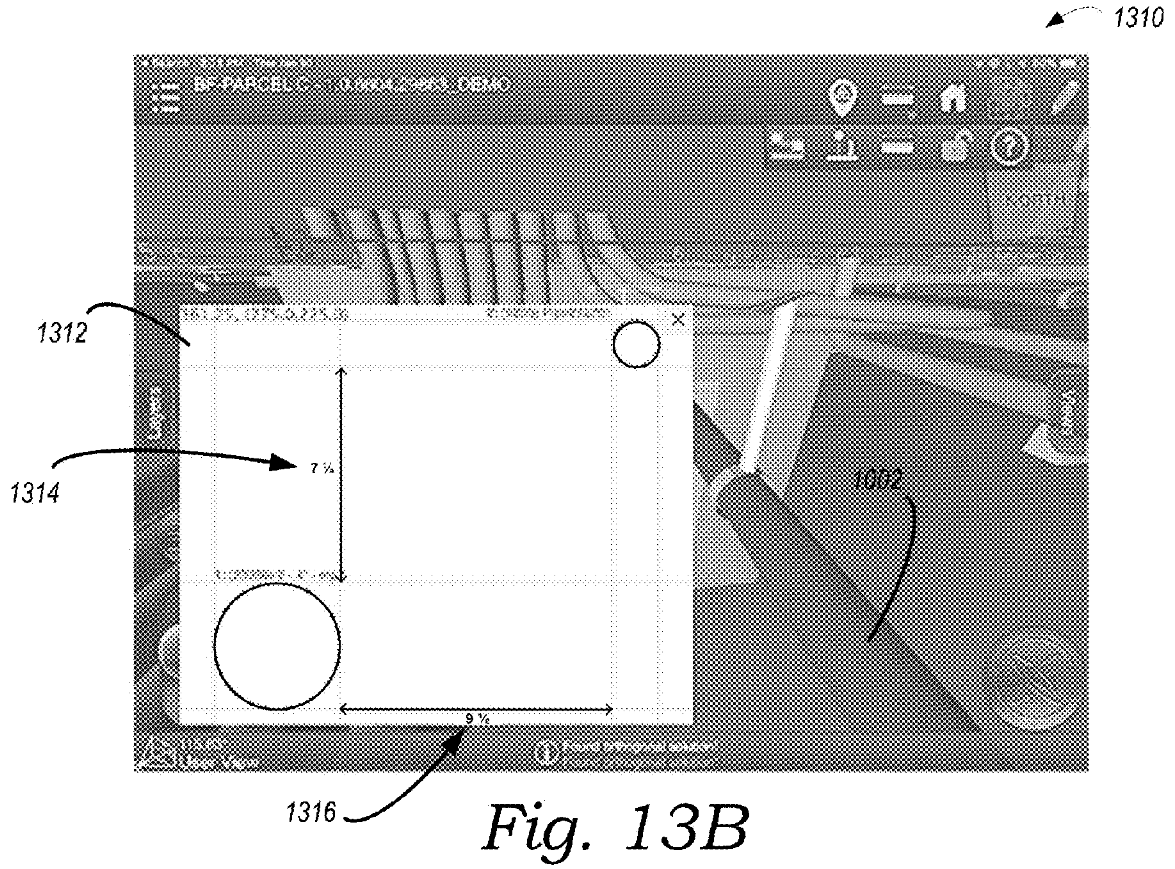
FIG. 13B depicts an example output of a computing device, in accordance with one embodiment of the present disclosure.

At block 1106, for each given mesh the computing device determined to be intersecting with the area of interest (e.g., the two-dimensional plane), the computing device determines the portion of the given mesh that intersects with the area of interest. In one implementation, a given portion of a mesh that intersects with the area of interest may take the form of a compilation of line segments formed as a result of triangles representing the mesh intersecting with the two-dimensional plane. Thus, a computing device may determine a portion of a mesh that intersects with the area of interest in largely the same process described above with respect to flow diagram 500. As described above, this generally includes the computing device using geometry to determine the coordinates of each line segment formed as a result of the two-dimensional plane intersecting with the triangles At block 1108, once the computing device determines the portions of each mesh that intersect with the area of interest, the computing device generates a two-dimensional drawing based on these determined portions by drawing corresponding line segments onto a two-dimensional display and supplementing this two-dimensional display with relevant dimension information based on coordinates of the line segments. To illustrate this, FIG. 12B depicts an example snapshot 1210 of a GUI, which includes a three-dimensional view of the construction project depicted in snapshot 1000 (FIG. 10) and 1200 (FIG. 12A). Further depicted in snapshot 1210 is an example two-dimensional drawing 1212 that may be generated at block 1108. As depicted, two-dimensional drawing 1212 may include line segments representing the portions of the identified meshes 1004*a* and 1004*b* that intersected with the two-dimensional plane 1202 (FIG. 12A). Similarly, FIG. 13B depicts an example snapshot 1310 of a GUI, which includes a three-dimensional view of the construction project depicted in snapshot 1000 (FIG. 10) and 1300 (FIG. 13A). Further depicted in snapshot 1310 is an example two-dimensional drawing 1312 that may be generated at block 1108. As depicted, two-dimensional drawing 1312 may include line segments representing the portions of the identified meshes 1004*a* and 1002 that intersected with the two-dimensional plane 1302 (FIG. 13A).

The computing device may supplement the two-dimensional drawing with dimension information in various ways. As one possibility, the computing device may identify any vertices present in the two-dimensional display (e.g., connection points formed between two different line segments that share one endpoint). The computing device may then use the coordinates of the lines segments to provide an indication of the dimensions of the portions of the mesh between the vertices. As another possibility, the computing device may identify the left-most line segment of the two-dimensional display and the right-most line segment of the two-dimensional display. The computing device may then use coordinates of these line segments to provide an indication of the distance between these two line segments. As yet another possibility, the computing device may identify line segments that are associated with different meshes. The computing device may then use the coordinates of the line segments to provide an indication of the distance between the line segments of different meshes.

As depicted in FIG. 12B, the computing device may supplement two-dimensional drawing 1212 with dimension information 1214, which indicates the distance between pipe 1004*a* and pipe 1004*b*. Likewise, as depicted in FIG. 13B, the computing device may supplement two-dimensional drawing 1312 with dimension information 1314 and 1316, which indicates the vertical and horizontal distances, respectively, between pipe 1004*a* and pipe 1002.

Figure 14:
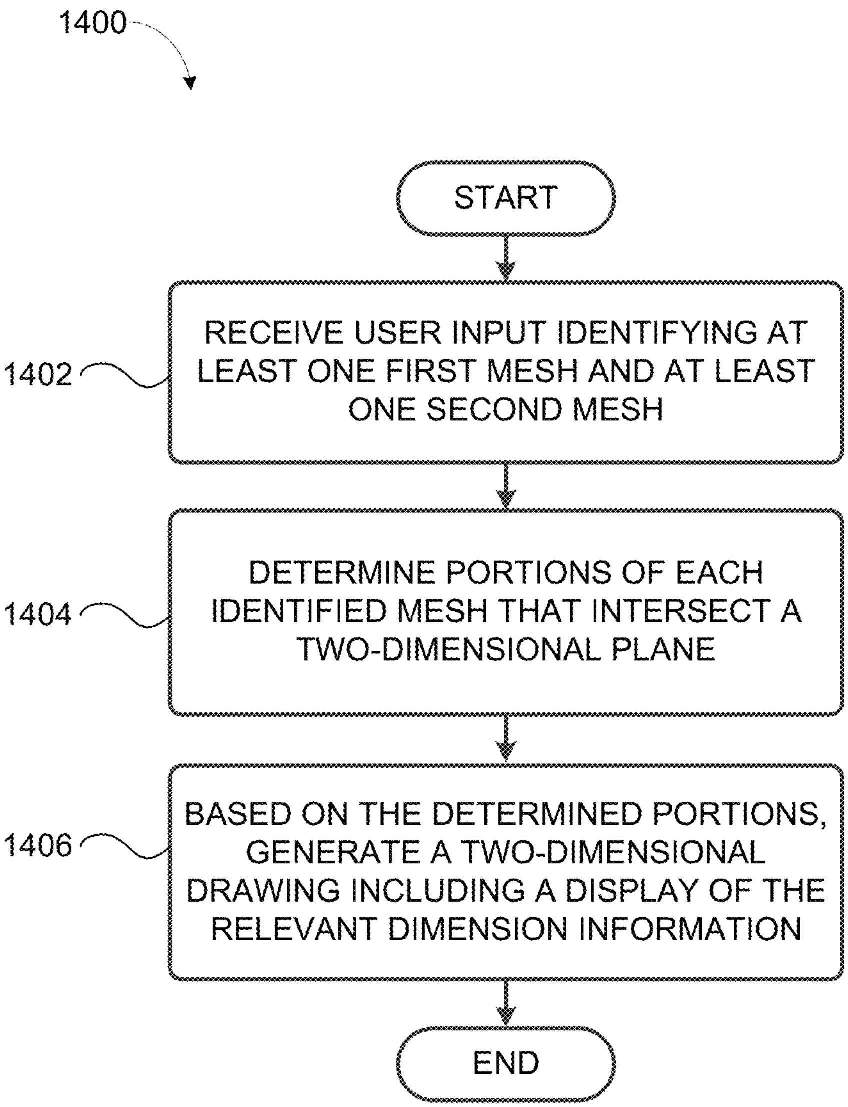
FIG. 14 is a flow diagram depicting example operations for generating a two-dimensional dimension view, according to one embodiment of the present disclosure.

Turning now to flow diagram 1400 of FIG. 14, an example of another process carried out in accordance with the disclosed software tool for generating a custom two-dimensional view containing dimensioning information is illustrated and described. In practice, this process is typically commenced while the computing device is displaying a three-dimensional BIM view via a GUI. In some implementations, for instance, the computing device may receive an indication from the user requesting the creation of a dimension view, such as the push of a button or the selection of a menu command. However, other ways to commence the process are possible as well.

Once the process is commenced, the process generally involves the following operations: (i) at block 1402, the computing device receives a user input identifying at least one first mesh and at least one second mesh, (ii) at block 1404, the computing device determines the portions of each identified mesh that intersect with a two-dimensional plane, and (ii) at block 1406, the computing device generates a two-dimensional drawing including a display of relevant dimensioning information based on the determined portions. Each of these operations will now be discussed in further detail.

At block 1402, while the computing device is presenting a three-dimensional BIM view rendered using a BIM file, the computing device may receive a user input that identifies at least one first mesh and at least one second mesh for which it is desired to view dimension information. In one implementation of this, the computing device may receive a first user input, such as a mouse click or a tap on a first mesh being displayed in the three-dimensional BIM view, and a second user input, such as another mouse click or tap on a second mesh being displayed in the three-dimensional BIM view.

Figure 15A:
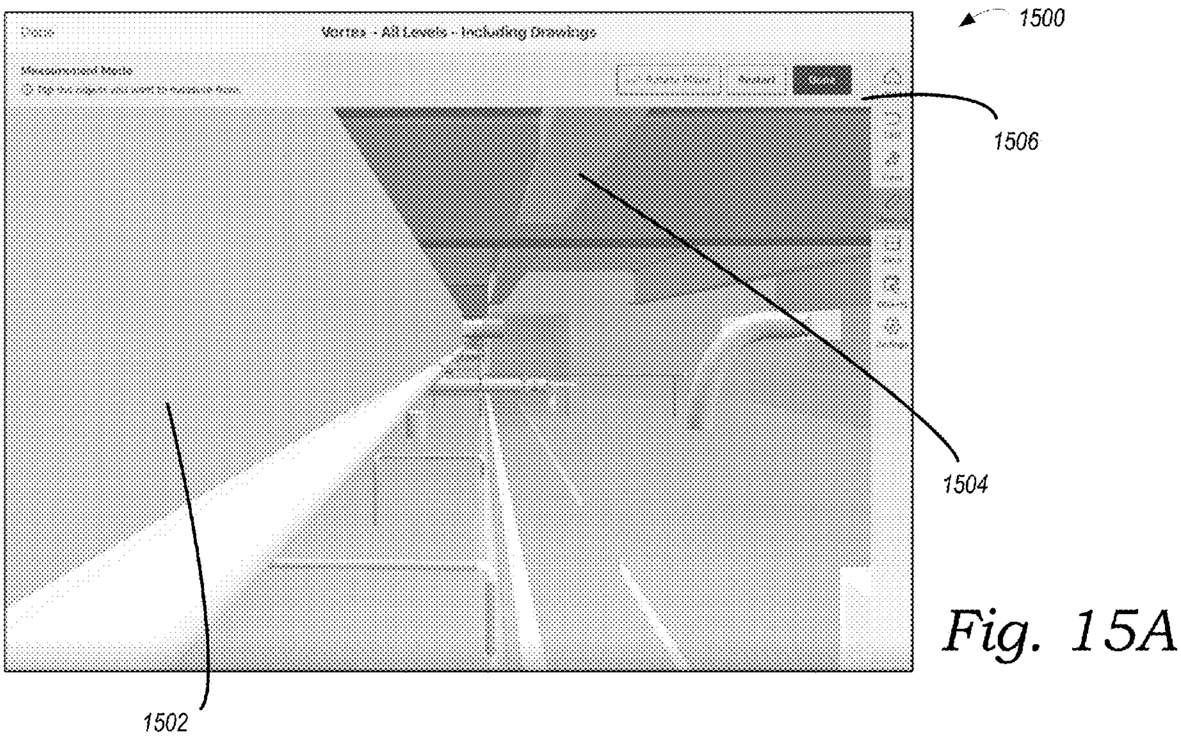
FIG. 15A depicts an example output of a computing device, in accordance with one embodiment of the present disclosure.
Figure 15B:
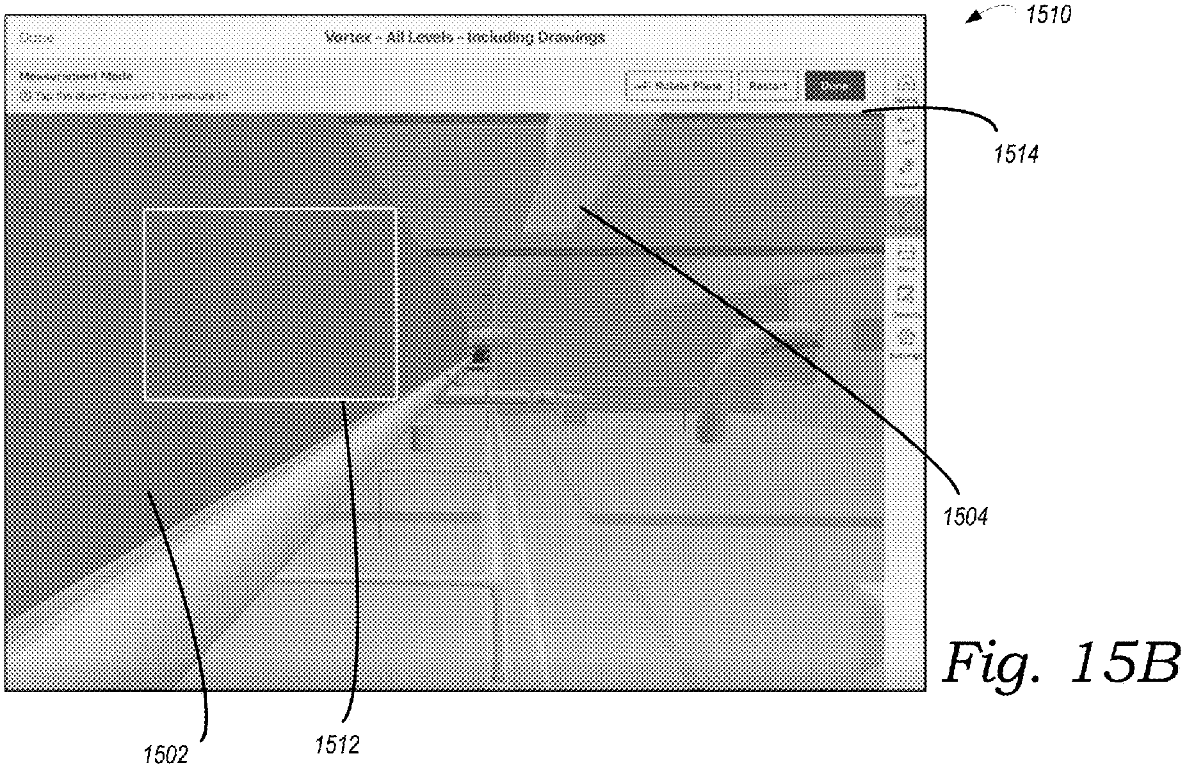
FIG. 15B depicts an example output of a computing device, in accordance with one embodiment of the present disclosure.
Figure 15C:
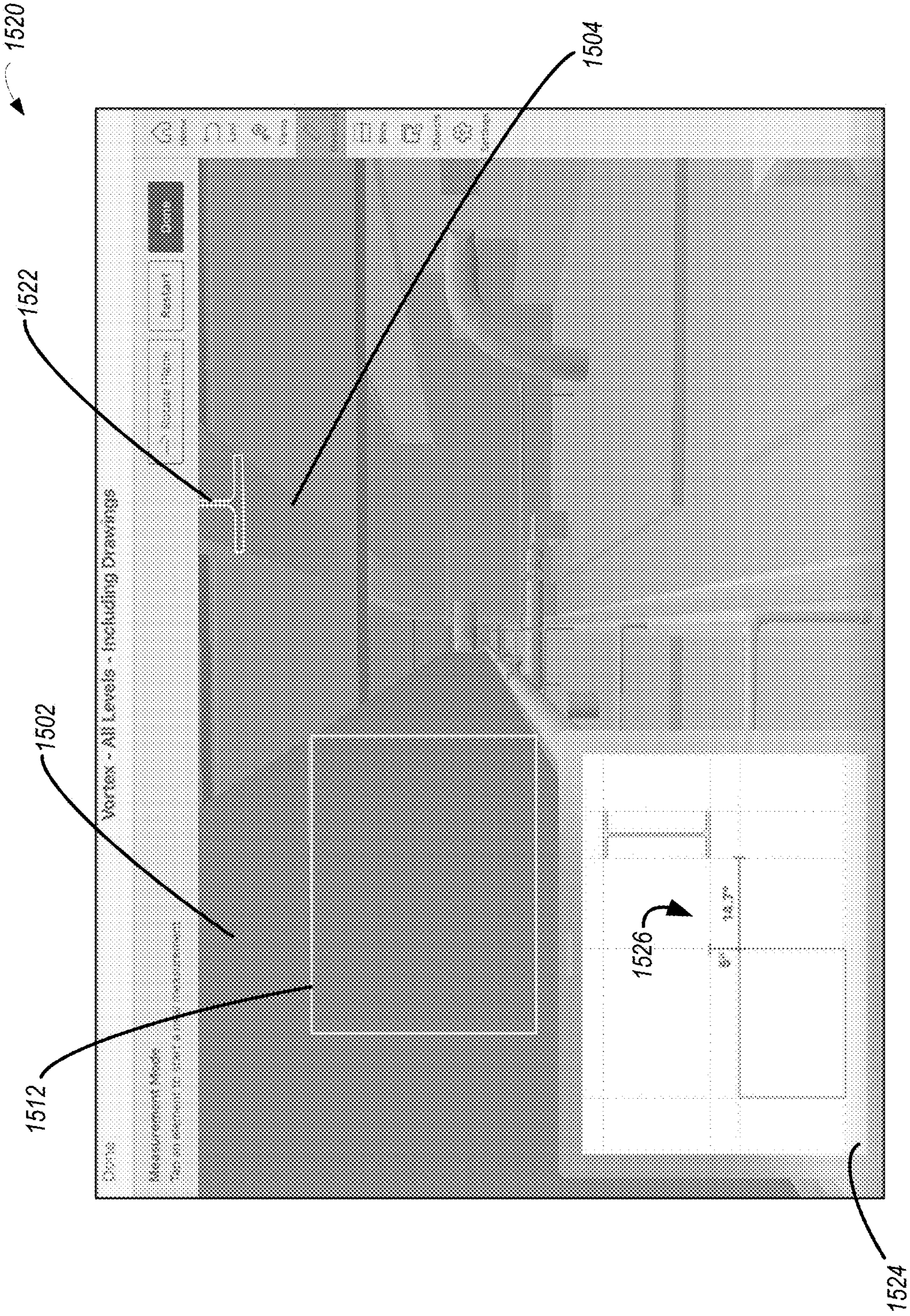
FIG. 15C depicts an example output of a computing device, in accordance with one embodiment of the present disclosure.

To help illustrate one example of this, FIGS. 15A-C depict example snapshots 1500, 1510, and 1520, respectively, of GUIs that include three-dimensional views of a construction project. As depicted in each snapshot, the three-dimensional view of the construction project may include a view of several meshes that represent various physical elements in the construction project, such as mesh 1502, which may represent a wall, and mesh 1504, which may represent a support girder, among other possible examples. As indicated, in one implementation the computing device may receive a user input identifying a first mesh by, for instance, receiving a user input in the form of a mouse click or a tap on one of the displayed meshes. In the examples depicted in FIGS. 15A-C, the computing device may receive a user input in the form of a mouse click or a tap on an area displaying mesh 1502, which the computing device may responsively regard as an identification of a first mesh. Similarly, the computing device may receive a user input in the form of a mouse click or a tap on an area displaying mesh 1504, which the computing device may responsively regard as an identification of a second mesh. The computing device may receive a user input identifying a first mesh in other ways as well.

In some implementations, the computing device may present on the GUI various visual indications that may help facilitate selection of a mesh or may help identify a mesh that has been selected. As one possibility, the computing device may present a message that prompts a user to select a first mesh, via for instance a mouse click or a tap. One example of such a message may be message 1506 depicted in snapshot 1500, which may prompt a user to "Tap the object you want to measure from." Once the computing device has received a user input identifying a first mesh, the computing device may present a message that prompts a user to select a second mesh, via for instance a mouse click or a tap. One example of such a message may be message 1514 depicted in snapshot 1510, which may prompt a user to "Tap the object you want to measure to." Other example messages or prompts are possible as well.

As another possibility, the computing device may change a color of a mesh in response to receiving a user input identifying that mesh. To illustrate one example of this, FIG. 15B depicts an example snapshot 1510 of a GUI, which includes a three-dimensional view of a construction project. As depicted, in response to receiving a user input, such as a mouse click or a tap, that identifies mesh 1502, for example, the computing device may change the color of mesh 1502 to indicate to the user that the user has identified mesh 1502. Similarly, as depicted in snapshot 1520 in FIG. 15C, in response to receiving a user input, such as a mouse click or a tap, that identifies mesh 1504, for example, the computing device may change the color of mesh 1504 to indicate to the user that the user has identified mesh 1504. As depicted in snapshots 1510 and 1520, the computing device may change the color of meshes 1502 and 1504 from a first color (e.g., grey) to a second color (e.g., blue), where the second color is different than any other color used to render the meshes in the three-dimensional display. In other embodiments, other color changes are possible as well.

Returning to FIG. 14 at block 1404, the computing device may next determine portions of each identified mesh that intersect a two-dimensional plane. In one example of this, the computing device may select a default two-dimensional plane to use to determine portions of each identified mesh that intersect the two-dimensional plane. The default two-dimensional plane may be selected as a two-dimensional plane that is oriented such that the z-axis of the three-dimensional BIM view is co-planar with the two-dimensional plane and is positioned a default distance (e.g., 6 feet) into the field of view. However, other two-dimensional planes may be selected as well, such as two-dimensional planes that are positioned at other distances into the field of view and/or are oriented in other manners. In some implementations, the computing device may present an option to receive a user input to select the position and orientation of the two-dimensional plane. For example, the computing device may display an indication of the two-dimensional plane and may be configured to reposition the two-dimensional plane by rotating it, resizing it, or repositioning it along one or more of the three axes of the three-dimensional BIM view based on receipt of a respective user input, such as a touch and drag, among others. Other ways of selecting a two-dimensional plane are possible as well.

The computing device may determine the portions of the first and second meshes that intersect with the two-dimensional plane using a process similar to that described above with respect to flow diagram 500 in FIG. 5. That process is described in further detail above with respect to flow diagram 500 and, for brevity's sake, is not repeated again here in detail. As general matter, however, the process may include, in one implementation, the computing device identifying the triangles comprising the first mesh that intersect with the two-dimensional plane and the triangles comprising the second mesh that intersect with the two-dimensional plane.

Once the computing device determines portions of each identified mesh that intersects a two-dimensional plane, the computing device may display an outline of the portion of each identified mesh that intersects the two-dimensional plane. As depicted, for instance, in snapshots 1510 and 1520, the computing device may display an outline 1512 of the intersection between the first mesh and the two-dimensional plane, and an outline 1522 of the intersection between the second mesh and the two-dimensional plane. In other examples, other intersections and other outlines are possible.

Returning again to FIG. 14 at block 1406, the computing device may next generate a two-dimensional drawing based on these determined intersections by drawing corresponding line segments onto a two-dimensional display and supplementing this two-dimensional display with relevant dimension information based on coordinates of the line segments. As one example of this, snapshot 1520 includes an example two-dimensional drawing 1524 that may be generated at block 1406. As depicted, two-dimensional drawing 1524 may include line segments representing the portions of the first mesh 1502 and portions of the second mesh 1504 that intersected with the two-dimensional plane.

As further depicted, the computing device may supplement the two-dimensional drawing 1524 with dimension information in various ways. As one possibility, the computing device may identify any vertices present in the two-dimensional display (e.g., connection points formed between two different line segments that share one endpoint). The computing device may then use the coordinates of the lines segments to provide an indication of the dimensions of the portions of the mesh between the vertices. As another possibility, the computing device may identify the left-most line segment of the two-dimensional display and the right-most line segment of the two-dimensional display. The computing device may then use coordinates of these line segments to provide an indication of the distance between these two line segments. As yet another possibility, the computing device may identify line segments that are associated with different meshes. The computing device may then use the coordinates of the line segments to provide an indication of the distance between the line segments of different meshes. Other ways to supplement a two-dimensional drawing with dimension information are possible as well.

As specifically depicted in snapshot 1520, the computing device may supplement two-dimensional drawing 1524 with dimension information 1526, which indicates (i) the horizontal distance between one edge of the wall represented by mesh 1502 and one edge of the girder represented by mesh 1504, and (ii) the vertical distance between another edge of the wall represented by mesh 1502 and another edge of the girder represented by mesh 1504.

V. CONCLUSION

Example embodiments of the disclosed innovations have been described above. Those skilled in the art will understand, however, that changes and modifications may be made to the embodiments described without departing from the true scope and spirit of the present invention, which will be defined by the claims.

For instance, those in the art will understand that the disclosed operations for generating two-dimensional drawings based on a BIM file and a three-dimensional BIM view may be implemented in other construction-related areas. The disclosed operations for generating two-dimensional drawings based on a BIM file and a three-dimensional BIM view could be used in other contexts as well.

Further, to the extent that examples described herein involve operations performed or initiated by actors, such as "humans," "operators," "users" or other entities, this is for purposes of example and explanation only. The claims should not be construed as requiring action by such actors unless explicitly recited in the claim language.

We claim:

1. A computing system comprising:

at least one processor;

a non-transitory computer-readable medium; and program instructions stored on the non-transitory computer-readable medium that are executable by the at least one processor to cause the computing system to:

render a view of at least a portion of a construction project, wherein the view comprises a three-dimensional display of at least (i) a first element of the construction project and (ii) a second element of the construction project;

receive a first input indicating a user's selection of the first element;

receive a second input indicating a user's selection of the second element; and based at least on receiving the first input and receiving the second input, generate a drawing that depicts portions of the first element and portions of the second element that intersect with a two-dimensional plane.

2. The computing system of claim 1, wherein the computing system further comprises program instructions that are executable by the at least one processor to cause the computing system to:

determine dimensioning information relating to the portions of the first element and the portions of the second element that intersect with the two-dimensional plane, and wherein the program instructions that are executable to cause the computing system to generate the drawing that depicts portions of the first element and portions of the second element that intersect with the two-dimensional plane comprise program instructions that are executable to cause the computing system to supplement the drawing with the determined dimensioning information.

3. The computing system of claim 1, wherein the computing system further comprises program instructions that are executable by the at least one processor to cause the computing system to:

based at least on receiving the first input, overlay on the three-dimensional display a depiction of the two-dimensional plane.

4. The computing system of claim 3, wherein the computing system further comprises program instructions that are executable by the at least one processor to cause the computing system to:

receive a third input requesting that the two-dimensional plane be adjusted; and based on the third input, modify the depiction of the two-dimensional plane, wherein the modifying of the depiction of the two-dimensional plane involves one of (a) changing a size of the two-dimensional plane, (b) repositioning the two-dimensional plane along one or more axes, or (c) rotating the two-dimensional plane about an axis.

5. The computing system of claim 1, wherein the program instructions that are executable to cause the computing system to render the view of at least the portion of the construction project comprise program instructions that are executable to cause the computing system to:

render the view of at least a portion of the construction project using a three-dimensional model file that defines a set of meshes, and wherein the program instructions that are executable to cause the computing system to based at least on receiving the first input and receiving the second input, generate the drawing that depicts portions of the first element and portions of the second element that intersect with the two-dimensional plane comprise program instructions that are executable to cause the computing system to:

based at least on receiving the first input and receiving the second input, identify, from among the set of meshes defined by the three-dimensional model file, a subset of meshes that intersect with the two-dimensional plane; and for each respective mesh in the identified subset of meshes, generate a respective dataset that defines a particular portion of the respective mesh that intersects with the two-dimensional plane.

6. The computing system of claim 5, wherein the program instructions that are executable to cause the computing system to, based at least on receiving the first input and receiving the second input, generate the drawing that depicts portions of the first element and portions of the second element that intersect with the two-dimensional plane comprise program instruction that are executable to cause the computing system to:

based at least on the respective dataset for each respective mesh in the identified subset of meshes, generate a compiled dataset that defines the drawing that depicts portions of the first element and portions of the second element that intersect with the two-dimensional plane; and render the drawing using the compiled dataset.

7. The computing system of claim 5, wherein each respective mesh in the identified subset of meshes comprises a plurality of triangles, and wherein the respective dataset for each respective mesh in the identified subset of meshes comprises data defining a plurality of line segments that each represent an intersection between a respective triangle of the respective mesh and the two-dimensional plane.

8. A method comprising:

rendering a view of at least a portion of a construction project, wherein the view comprises a three-dimensional display of at least (i) a first element of the construction project and (ii) a second element of the construction project;

receiving a first input indicating a user's selection of the first element;

receiving a second input indicating a user's selection of the second element; and based at least on receiving the first input and receiving the second input, generating a drawing that depicts portions of the first element and portions of the second element that intersect with a two-dimensional plane.

9. The method of claim 8, further comprising:

determining dimensioning information relating to the portions of the first element and the portions of the second element that intersect with the two-dimensional plane, and supplementing the drawing with the determined dimensioning information.

10. The method of claim 8, further comprising based at least on receiving the first input, overlaying on the three-dimensional display a depiction of the two-dimensional plane.

11. The method of claim 10, further comprising:

receiving a third input requesting that the two-dimensional plane be adjusted; and based on the third input, modifying the depiction of the two-dimensional plane, wherein the modifying of the depiction of the two-dimensional plane involves one of (a) changing a size of the two-dimensional plane, (b) repositioning the two-dimensional plane along one or more axes, or (c) rotating the two-dimensional plane about an axis.

12. The method of claim 8, wherein rendering the view of at least the portion of the construction project comprises:

rendering the view of at least a portion of the construction project using a three-dimensional model file that defines a set of meshes, and wherein based at least on receiving the first input and receiving the second input, generating the drawing that depicts portions of the first element and portions of the second element that intersect with the two-dimensional plane comprises:

based at least on receiving the first input and receiving the second input, identifying, from among the set of meshes defined by the three-dimensional model file, a subset of meshes that intersect with the two-dimensional plane; and for each respective mesh in the identified subset of meshes, generating a respective dataset that defines a particular portion of the respective mesh that intersects with the two-dimensional plane.

13. The method of claim 12, wherein generating the drawing that depicts portions of the first element and portions of the second element that intersect with the two-dimensional plane comprises:

based at least on the respective dataset for each respective mesh in the identified subset of meshes, generating a compiled dataset that defines the drawing that depicts portions of the first element and portions of the second element that intersect with the two-dimensional plane; and rendering the drawing using the compiled dataset.

14. A non-transitory computer-readable storage medium having program instructions stored thereon that are executable to cause a computing system to:

render a view of at least a portion of a construction project, wherein the view comprises a three-dimensional display of at least (i) a first element of the construction project and (ii) a second element of the construction project;

receive a first input indicating a user's selection of the first element;

receive a second input indicating a user's selection of the second element; and based at least on receiving the first input and receiving the second input, generate a drawing that depicts portions of the first element and portions of the second element that intersect with a two-dimensional plane.

15. The non-transitory computer-readable storage medium of claim 14, wherein the program instructions are further executable to cause the computing system to:

determine dimensioning information relating the portions of the first element and the portions of the second element that intersect with the two-dimensional plane, and wherein the program instructions executable to cause the computing system to generate the drawing that depicts portions of the first element and portions of the second element that intersect with the two-dimensional plane comprise program instruction executable to cause the computing system to supplement the drawing with the determined dimensioning information.

16. The non-transitory computer-readable storage medium of claim 14, wherein the program instructions are further executable to cause the computing system to:

based at least on the first input, overlay on the three-dimensional display a depiction of the two-dimensional plane.

17. The non-transitory computer-readable storage medium of claim 16, wherein the program instructions are further executable to cause the computing system to:

receive a third input requesting that the two-dimensional plane be adjusted; and based on the third input, modify the depiction of the two-dimensional plane, wherein the modifying of the depiction of the two-dimensional plane involves one of (a) changing a size of the two-dimensional plane, (b) repositioning the two-dimensional plane along one or more axes, or (c) rotating the two-dimensional plane about an axis.

18. The non-transitory computer-readable storage medium of claim 14, wherein the program instructions executable to cause the computing system to render the view of at least the portion of the construction project comprise program instructions that are executable to cause the computing system to:

render the view of at least a portion of the construction project using a three-dimensional model file that defines a set of meshes, and wherein the program instructions executable to cause the computing system to based at least on receiving the first input and receiving the second input, generate the drawing that depicts portions of the first element and portions of the second element that intersect with the two-dimensional plane comprise program instruction that are executable to cause the computing system to:

based at least on receiving the first input and receiving the second input, identify, from among the set of meshes defined by the three-dimensional model file, a subset of meshes that intersect with the two-dimensional plane; and for each respective mesh in the identified subset of meshes, generate a respective dataset that defines a particular portion of the respective mesh that intersects with the two-dimensional plane.

19. The non-transitory computer-readable storage medium of claim 18, wherein the program instructions executable to cause the computing system to generate the drawing that depicts portions of the first element and portions of the second element that intersect with the two-dimensional plane comprise program instruction that are executable to cause the computing system to:

based at least on the respective dataset for each respective mesh in the identified subset of meshes, generate a compiled dataset that defines the drawing that depicts portions of the first element and portions of the second element that intersect with the two-dimensional plane; and render the drawing using the compiled dataset.

20. The non-transitory computer-readable storage medium of claim 18, wherein each respective mesh in the identified subset of meshes comprises a plurality of triangles, and wherein the respective dataset for each respective mesh in the identified subset of meshes comprises data defining a plurality of line segments that each represent an intersection between a respective triangle of the respective mesh and the two-dimensional plane.

* * * * *